(12) United States Patent
Yamada

(10) Patent No.: US 8,339,079 B2
(45) Date of Patent: Dec. 25, 2012

(54) POWER SEMICONDUCTOR CHIP, POWER SEMICONDUCTOR MODULE, INVERTER APPARATUS, AND INVERTER-INTEGRATED MOTOR

(75) Inventor: Naoki Yamada, Toyota (JP)

(73) Assignee: Aisin Seiki Kabushiki Kaisha, Aichi-ken (JP)

( * ) Notice: Subject to any disclaimer, the term of this patent is extended or adjusted under 35 U.S.C. 154(b) by 348 days.

(21) Appl. No.: 12/674,124

(22) PCT Filed: Sep. 10, 2008

(86) PCT No.: PCT/JP2008/066313
§ 371 (c)(1),
(2), (4) Date: Feb. 18, 2010

(87) PCT Pub. No.: WO2009/034993
PCT Pub. Date: Mar. 19, 2009

(65) Prior Publication Data
US 2011/0148337 A1 Jun. 23, 2011

(30) Foreign Application Priority Data

Sep. 12, 2007 (JP) ................... 2007-237033
Feb. 12, 2008 (JP) ................... 2008-030545

(51) Int. Cl.
*H02P 6/14* (2006.01)
(52) U.S. Cl. ................ 318/400.26; 318/400.3; 257/618; 257/620; 62/228.4
(58) Field of Classification Search ............ 318/400.26, 318/139, 254, 280, 282, 439, 400.3, 400.32; 257/206, 401, 618, 620; 62/228.4
See application file for complete search history.

(56) References Cited

U.S. PATENT DOCUMENTS

| 5,300,815 | A |   | 4/1994 | Rostoker |         |
|-----------|---|---|--------|----------|---------|
| 5,340,772 | A | * | 8/1994 | Rosotker | 438/460 |
| 5,341,024 | A | * | 8/1994 | Rosotker | 257/620 |
| 5,532,934 | A | * | 7/1996 | Rosotker | 716/122 |

(Continued)

FOREIGN PATENT DOCUMENTS

JP    6-097279 A    4/1994

(Continued)

OTHER PUBLICATIONS

Tsutomu Uesugi, "Power Devices for Automotive Applications-Review of Technologies for Low Power Dissipation and High Ruggedness-", R&D Review of Toyota Central R&D Lab, Jun. 2006, pp. 3-10, vol. 35, No. 2.

(Continued)

*Primary Examiner* — Paul Ip
(74) *Attorney, Agent, or Firm* — Sughrue Mion, PLLC

(57) ABSTRACT

Provided is an inverter-integrated motor including a motor and an inverter integrated in an efficient manner. Also provided is a semiconductor chip that can be used in this motor. An IGBT chip is constructed with an emitter terminal being provided at the apex of one face of a die having a regular triangular surface shape, a gate terminal being provided adjacent the opposite side to the apex, and a collector terminal being provided on the other face. A power semiconductor module is constructed with placing apices of the IGBT chips having the emitter terminals in abutment against each other. Six such power semiconductor chips are arranged in a regular hexagonal pattern to together constitute an inverter for converting DC power into three-phase AC power.

18 Claims, 14 Drawing Sheets

U.S. PATENT DOCUMENTS

| | | | |
|---|---|---|---|
| 5,631,581 A * | 5/1997 | Rostoker et al. | 326/101 |
| 5,744,856 A * | 4/1998 | Rostoker | 257/618 |
| 5,744,858 A * | 4/1998 | Rostoker | 257/666 |
| 5,753,970 A * | 5/1998 | Rostoker | 257/668 |
| 5,789,770 A * | 8/1998 | Rostoker et al. | 257/206 |
| 5,801,422 A * | 9/1998 | Rostoker et al. | 257/369 |
| 5,808,330 A * | 9/1998 | Rostoker et al. | 257/208 |
| 5,811,863 A * | 9/1998 | Rostoker et al. | 257/401 |
| 5,822,214 A * | 10/1998 | Rostoker et al. | 716/123 |
| 5,834,821 A * | 11/1998 | Rostoker et al. | 257/401 |
| 5,859,448 A * | 1/1999 | Brassington | 257/203 |
| 5,864,165 A * | 1/1999 | Rostoker et al. | 257/401 |
| 5,872,380 A * | 2/1999 | Rostoker et al. | 257/369 |
| 5,889,329 A * | 3/1999 | Rostoker et al. | 257/758 |
| 5,973,376 A * | 10/1999 | Rostoker et al. | 257/401 |
| 6,097,073 A * | 8/2000 | Rostoker et al. | 257/401 |
| 6,312,980 B1 * | 11/2001 | Rostoker et al. | 438/197 |
| 6,542,365 B2 | 4/2003 | Inoue | |
| 7,207,187 B2 * | 4/2007 | Funahashi et al. | 62/228.4 |
| 2004/0056284 A1 | 3/2004 | Nagaoka et al. | |
| 2005/0151167 A1 | 7/2005 | Onishi et al. | |

FOREIGN PATENT DOCUMENTS

| | | |
|---|---|---|
| JP | 7142584 A | 6/1995 |
| JP | 10-248198 A | 9/1998 |
| JP | 2004-047923 A | 2/2004 |
| JP | 2004-063860 A | 2/2004 |
| JP | 2004-201462 A | 7/2004 |
| JP | 2005-198443 A | 7/2005 |

OTHER PUBLICATIONS

International Search Report PCT/JP2008/066313, Dec. 16, 2008.

International Preliminary Report on Patentability dated Apr. 8, 2010, 7 pages.

Office Action issued in Japanese Patent Application No. 2008-030545 dated Aug. 23, 2012.

* cited by examiner

冷却水

US 8,339,079 B2

POWER SEMICONDUCTOR CHIP, POWER SEMICONDUCTOR MODULE, INVERTER APPARATUS, AND INVERTER-INTEGRATED MOTOR

TECHNICAL FIELD

The present invention relates to an inverter-integrated motor comprising a motor and an inverter integrated together, a power semiconductor chip and a power semiconductor module for use in the inverter-integrated motor, and an inverter apparatus using the power semiconductor module.

BACKGROUND ART

There is known a technique for forming an entire apparatus compact by integrating a motor with an inverter for driving the motor. U.S. Pat. No. 7,207,182B2 (Patent Document 1) discloses a technique relating to an inverter-integrated electric driven compressor for a vehicle. The inverter unit of this apparatus, as is well-known, comprises six MOS transistor modules, a smoothing capacitor, etc. In operation, DC power supplied from a battery is converted into three-phase AC power and this power is supplied to the motor unit of the compressor. In an outer peripheral face of a peripheral wall of a motor housing, there is provided a pedestal portion which includes a flat pedestal face. Each power MOS transistor module is fixed to this pedestal face via a resin insulating sheet by means of a screw 12. Three AC terminals extended from the inverter are connected to respective three-phase stator coils of the motor via lead wires.

Further, in a motor, heat management for restricting heat generation in the inverter is also important. In the case of the technique of Patent Document 1, the motor housing is utilized for discharging heat generated from the inverter. U.S. Pat. No. 6,542,365 (Patent Document 2) discloses a semiconductor switching module capable of cooling from both sides of the semiconductor chip. According to this technique, the both sides cooling is realized by a sandwiched arrangement in which the high-side semiconductor chip and the low-side semiconductor chip are sandwiched between a high-side plate and a low-side plate and a middle-side plate, respectively.

Patent Document 1: U.S. Pat. No. 7,207,187 B2 (column 19, L15 through column 23, L47, FIGS. 1, 3 and 5, etc.)

Patent Document 2: U.S. Pat. No. 6,542,365 B2 (column 18, L30 through column 20, L60, column 22, L39 through column 23, L3, FIGS. 38, 43, etc.)

DISCLOSURE OF THE INVENTION

With the techniques disclosed in Patent Document 1 and Patent Document 2, effective cooling of the inverter is possible. However, cooling is needed for the motor as well, so the inverter and the motor need to be cooled separately. Even when the inverter and the motor are integrated together as is the case with Patent Document 1, since only a portion of the peripheral wall of the motor is cooled, cooling of the motor is still needed separately. Further, while the stator coils of the motor are under a balanced condition relative to the motor shaft, the lengths of the connecting wires of the three phases are not. If the motor and the inverter are integrated as in Patent Document 1, the lengths of the connecting wires of the three phases can be short. Yet, as the inverter is provided in the peripheral wall of the motor, the lengths of the connecting wires are not balanced or uniform. The semiconductors (transistor module, chip) disclosed in Patent Document 1 and Patent Document 2 have square or rectangular shapes. This squire (rectangular) shape hinders efficient layout of the inverter in the direction of the motor axis, thus rendering the integration of the motor and the inverter difficult.

The present invention has been made in view of the above-described state of the art. The primary object of the present invention is to provide an inverter-integrated motor having superior balance among the three phases of the wires between the inverter and the motor and having also superior cooling performance. A further object of the present invention is to provide a semiconductor chip that can be suitably used in this inverter-integrated motor.

For accomplishing the above-noted object, according to a characterizing feature of a power semiconductor chip relating to the present invention that constitutes a power semiconductor device for use in a power electronics circuit, a die of the power semiconductor chip has a regular triangular surface shape.

In a power semiconductor device such as a transistor or a diode constituted of a power semiconductor chip, often a plurality of the devices are connected in parallel for the sake of improvement of an electric characteristics such as a current capacity. In this regard, the equilateral triangle is a shape that can be easily formed into a polygonal shape such as a rectangle, a hexagon, etc. through various combinations thereof. Therefore, the designing engineer can flexibly combine a required number of power semiconductor chips in accordance with the desired or needed electrical characteristics. For instance, the designing engineer can construct an optimal inverter in accordance with various electrical characteristics of an inverter-integrated motor comprised of a motor and an inverter integrated together. Therefore, according to the above-described characterizing feature of the invention, there can be provided a semiconductor chip that can be used suitably in an inverter-integrated motor.

Further, a semiconductor wafer has a circular shape. When dies of a regular triangular surface shape are to be cut therefrom, the area of the semiconductor wafer that can be effectively used thereof can be larger as compared with a case of dies of a square surface shape being cut therefrom.

According to a further characterizing feature of the inventive power semiconductor chip, a plurality of power semiconductor cells having a regular hexagonal column shape or a circular cylindrical shape are arranged in a zigzag pattern, and these respective semiconductor cells are connected and integrated together to form the power semiconductor chip.

In a single power semiconductor chip, a plurality of power semiconductor cells having a regular hexagonal column shape or a circular cylindrical shape are arranged in a zigzag pattern. Therefore, this power semiconductor chip has a high degree of integration, i.e. more components per chip. In particular, the regular hexagonal shape that is the cross sectional shape of a regular hexagonal column allows gapless and flat layout in the honeycomb configuration. So, this shape permits the degree of integration to be very high. Moreover, the zigzag pattern layout of the power semiconductor cells allows readiness in the geometrical configuration of the wiring of the respective power semiconductor chip, thus enabling advantageous reduction in the total wiring length. Further, the zigzag pattern layout allows also uniformity of impedance between the electrode portions of the respective power semiconductor cells and the terminals of the power semiconductor chip.

According to a still further characterizing feature of the inventive power semiconductor chip, the power semiconductor chip comprises a power transistor having three terminals of an emitter/source, a collector/drain and a base/gate;

the emitter/source terminal is disposed at the apex of one face of the die which has a regular triangular shape;

the base/gate terminal is disposed adjacent the opposite side to the apex of the one face; and the collector/drain terminal is disposed on the other face.

When a plurality of equilateral triangular power semiconductor chips are combined without any gap therebetween, the mounting efficiency can be improved by placing the apices of the chips in abutment against each other. The emitter/source terminal is subjected to a large current therethrough. So, depending on the combinational configuration of the power semiconductor chips, the influence of impedance of the wires connecting between the terminals of the plurality of power semiconductor chips is apt to manifest itself in the circuit. In this regard, with the above-described characterizing construction of the invention disposing the emitter/source terminals at the apices that are placed in abutment against each other, it is possible to restrict the impedance (especially, inductance) of the wires connecting the emitter/source terminals of the plurality of power semiconductor chips. In the designing of a motor or motor control scheme, the problem of impedance cannot be ignored and handling thereof is difficult. Therefore, when power semiconductor chips are to be combined, it is very useful to structurally reduce the inductance. As described above, with the characterizing feature of the invention, there can be provided a semiconductor chip that can be suitably used in an inverter-integrated motor.

According to a still further characterizing feature of the inventive power semiconductor chip, a plurality of power semiconductor cells having a regular hexagonal column shape or a circular cylindrical shape are arranged in a zigzag pattern, and these respective semiconductor cells are connected and integrated together to form the power semiconductor chip;

the power semiconductor cell comprises an insulated gate bipolar transistor having three electrodes of an emitter electrode, a collector electrode and a gate electrode; and the gate electrode is formed, via an insulating layer, inside a trench in the form of a vertical pit that is completed within the single power semiconductor cell.

A conventional insulated gate bipolar transistor (IGBT) having a trench gate structure has a trench structure wherein its trench extends to the terminal ends of one power semiconductor cell. On the other hand, the trench gate structure of the power semiconductor cell according to the present invention, this is a vertical pit like structure that is completed in a single power semiconductor cell. Therefore, in the surface of the power semiconductor cell, the area to be occupied by the gate can be reduced relatively and the area of the emitter through which the current flows can be increased correspondingly. As a result, the impedance at the emitter electrode of the power semiconductor cell and the emitter terminal of the power semiconductor chip can be reduced.

According to a still further characterizing feature of the power semiconductor chip of the present invention, the power semiconductor cells include, at the respective gate electrodes thereof to be connected to the gate terminal of the power semiconductor chip, a gate resistor according to a wiring distance from the gate terminal.

At the gate electrode of each power semiconductor cell, there is provided a gate resistor according to a wiring distance from the gate terminal of the power semiconductor chip. With this, it is possible to render uniform propagation delays of drive signals from this gate terminal to the gate electrodes of the respective cells. Consequently, the power semiconductor chip can operate in a stable manner.

According to a still further characterizing feature of the power semiconductor chip of the present invention, the chip is integrated to a wafer having a lattice structure [1, 1, 1].

Semiconductor such as silicon has a diamond structure and its crystal has the characteristics called "cleavage crack" of being easily cracked along a predetermined plane. For instance, the wafer having the lattice structure [1, 0, 0] is an orthogonal lattice. When a dicing is to be effected from a wafer relative to a regular triangular power semiconductor chip, cutting is needed along the direction of 60 degrees or 120 degrees relative to one cleavage crack plane. In doing this, there is possibility of a crack being formed along the cleavage plane within a small area, the crack resulting in step-like or jagged cut. Therefore, in order to avoid adverse effect on the circuit of the power semiconductor chip, there is a need to secure a sufficient margin between adjacent power semiconductor chips. On the other hand, the crystal of the lattice [1, 1, 1] has a cleavage crack along the 60 degrees and 120 degrees direction relative to one cleavage plane. For this reason, when a dicing of the right rectangular power semiconductor chip is effected from the wafer having the lattice [1, 1, 1] crystal structure, there is formed no such step-like or jagged cut line in the small area. Therefore, there is no need to secure a large margin on the wafer 300 with taking the possibility of cut line being formed step-like or jagged. Consequently, the integration degree on the wafer can be increased.

According to a characterizing feature of a power semiconductor module of the present invention, the module is formed by electrically conductively interconnecting same terminals of either one type of the power semiconductor chips described above.

For a power semiconductor device such as a transistor, a diode or the like for use in a power electronics circuit, various electrical characteristics (such as current capacity) are required, depending on the characteristics of the circuit. However, it is not practically feasible to prepare a number of power semiconductor chips in accordance with all of such requirements. According to the above-described characterizing feature of the invention, it is possible to obtain power semiconductor modules of differing electric characteristics, by electrically conductively interconnecting same terminals of a plurality of power semiconductor chips. Namely, by forming a few kinds of power semiconductor chips into modules, it becomes possible to construct a power semiconductor module corresponding to many kinds of power semiconductor devices. For instance, the designing engineer can construct a power semiconductor module for forming the optimal inverter, according to a variety of electric characteristics of an inverter-integrated motor comprised of a motor and an inverter integrated together.

Also, according to a further characterizing feature of the power semiconductor module of the present invention, the module is formed into a regular hexagonal shape by interconnecting six of the power semiconductor chips with placing the apices of the power semiconductor chips in abutment against each other.

With the above-described characterizing feature, a regular hexagonal power semiconductor module is formed by combining six right triangles together. As the regular triangular power semiconductor chips can be combined in an efficient manner, the mounting efficiency of module circuits in forming the power semiconductor chip modular can be enhanced.

Still preferably, the power semiconductor chips comprises power transistors (bipolar, FET, IGBT, etc.) and emitter/drain terminals are provided at the apices thereof to be placed in abutment against each other. At the center of the regular hexagonal power semiconductor module, the apices of the regular triangular power semiconductor chips are in abutment against each other. In this way, if the abutting apices comprise emitter terminals (or drain terminals, hereinafter), the emitter terminals of the plurality of power semiconductor chips can be connected by the shortest possible distance. As a large current flows through an emitter terminal of a power transistor, a high impedance of the wire interconnecting the emitter terminals will be detrimental for stable operation of the circuit. However, if the emitter terminals are interconnected by the shortest possible distance as described above, the impedance (especially, inductance) can be restricted, thus contributing to stability of the operation of the module circuit comprised of the modular power semiconductor chip.

According to a still further characterizing feature of the power semiconductor module of the present invention, the power semiconductor chips connected in the regular hexagonal shape comprise power transistors;

one face of a die of a same shape as the power semiconductor module of the power transistors is an anode terminal and the other face thereof is a cathode terminal and there are provided two of the power semiconductor chips of a different kind to be connected as regenerating diodes to the power transistors; and the power semiconductor transistors as the regenerating diodes are disposed in such a manner that one sides of the respective transistors are disposed parallel relative to two sides adjacent across one side of the power transistor, so that the eight power semiconductor chips in total together form an isosceles trapezoidal shape.

With the above-described characterizing feature, the power transistor devices and the regenerative diode devices can be mounted on a single power transistor module. As a result, the mounting area of the circuit can be reduced advantageously.

According to a still further characterizing feature of the power semiconductor module of the present invention, the module is formed by electrically conductively interconnecting same terminals of the power semiconductor chips of any one of the above-described configurations; and three of the power semiconductor chips are connected in an isosceles trapezoidal shape with placing the apices of the regular triangular power transistor chips in abutment against each other.

With the above-described characterizing feature, an isosceles trapezoidal is formed by combining three regular triangles. As the regular triangular power semiconductor chips can be combined in an efficient manner, the mounting efficiency of module circuits in forming the power semiconductor chip modular can be enhanced.

Still preferably, the power semiconductor chips comprises power transistors (bipolar, FET, IGBT, etc.) and emitter/drain terminals are provided at the apices thereof to be placed in abutment against each other. At the center of the regular hexagonal power semiconductor module, the apices of the regular triangular power semiconductor chips are in abutment against each other. In this way, if the abutting apices comprise emitter terminals (or drain terminals, hereinafter), the emitter terminals of the plurality of power semiconductor chips can be connected by the shortest possible distance. As a large current flows through an emitter terminal of a power transistor, a high impedance of the wire interconnecting the emitter terminals will be detrimental for stable operation of the circuit. However, if the emitter terminals are interconnected by the shortest possible distance as described above, the impedance (especially, inductance) can be restricted, thus contributing to stability of the operation of the module circuit comprised of the modular power semiconductor chip.

According to a characterizing feature of an inverter apparatus relating to the present invention, the inverter apparatus is formed by using the power semiconductor module of any one of the above-described configurations and configured to covert a DC power into a three-phase AC power, and the apparatus is formed by arranging six of the power semiconductor modules in the form of a regular hexagon.

If the power semiconductor module is formed isosceles trapezoidal, as this isosceles trapezoidal shape is formed by combination of regular triangles, the angle of each opposed terminal end of the longer side (lower bottom) of the parallel sides is 60 degrees. Therefore, if six power semiconductor modules are arranged with legs of the isosceles trapezoidal shapes in opposition to each other, the modules can be arranged in an efficient manner in the form of a regular hexagon with the lower bottom of the isosceles trapezoid substantially forming one side and each apex having 120 degrees angle.

When the power semiconductor module has a regular hexagonal shape, its apex forms an angle of 120 degrees. Therefore, if the six power semiconductor modules are arranged with the sides of the regular hexagons being in opposition to each other, the modules can be arranged efficiently in the form of a regular hexagon, with each one side thereof being formed by one side of each regular hexagon.

In general, an inverter apparatus for converting a DC power into a three-phase AC power is formed with using six power transistor devices. With the above-described arrangement, such inverter apparatus can be formed efficiently. That is, the conventional inverter apparatuses are formed quadrate such as square or rectangular as exemplified by Patent Document 1 and Patent Document 2. In the case of the inventive characterizing construction described above, the inverter apparatus is formed regular hexagonal. The regular hexagon, which is a polygon, is a shape closer to the circle than the square (rectangle) is. Also, the cross section normal to the rotational axis direction of the motor which is a rotational apparatus is circular Then, if the inverter apparatus is to be integrated with the motor not in the lateral face of the motor, but along the rotational axis direction thereof, it is advantageous for the inverter apparatus to have a circular or nearly circular shape. In this regard, according to the above-described characterizing feature of the invention, the inverter apparatus is formed regular hexagonal, hence, being annular. Therefore, this is suitable when integrating the inverter apparatus and the motor along the rotational axis direction.

According to a further characterizing feature of an inverter-integrated motor relating to the present invention, the inverter apparatus is provided at an end of a motor, with a center of the inverter apparatus having a regular hexagonal shape being in agreement with a rotational shaft of the motor.

With this characterizing feature, the inverter apparatus can be integrated along the direction of the rotational shaft of the motor. Hence, it becomes possible to render uniform wiring distances of the three phases in the wiring between stator coils of the motor and the inverter apparatus. As a result, the balance of the three phases in the wring between the stator coils and the inverter apparatus is enhanced, thus contributing to stability of motor control.

According to a still further characterizing feature of an inverter-integrated motor relating to the present invention, there is provided a cooling unit between the motor and the inverter apparatus, the cooling unit being capable of cooling both the motor and the inverter apparatus.

With this characterizing feature, both the motor and the inverter apparatus can be cooled at a time by the cooling unit. Therefore, it becomes possible to provide an inverter-integrated motor having high cooling performance for both the motor and the inverter apparatus.

According to a still further characterizing feature of an inverter-integrated motor relating to the present invention, there is provided a rotation detecting sensor in a space formed at the center of the inverter apparatus having the regular hexagonal shape, the rotation detecting sensor being configured to detect a rotational position of a rotor of the motor based on a rotational position of the rotational shaft.

As described above, the inverter apparatus is formed by arranging six equilateral trapezoidal or regular hexagonal power semiconductor modules in the form of regular hexagon. If six regular triangles are arranged side by side, no free space is formed inside the regular hexagon. However, since the equilateral trapezoidal or regular hexagonal shape is a shape lacking one or three apices of the regular triangle, a free space is formed at the center of the regular hexagonal inverter apparatus and this free space allows insertion therethrough of the rotational shaft of the motor and allows also disposing of a rotation detecting sensor for detecting rotation of this rotational shaft. According to this characterizing feature, a rotation detecting sensor can be incorporated within the inverter apparatus. Therefore, there is no need to separately provide e.g. a mount plate or the like for the rotation detecting sensor, so cost reduction is made possible. Further, the inverter apparatus is often subjected to a waterproof arrangement, in order to prevent intrusion of water, oil, etc. In this regard, if the rotation detecting sensor is provided within the inverter apparatus with such arrangement as above, the rotational angle can be detected under the stable environment provided with this waterproof arrangement. Consequently, the reliability of the rotation sensor can be improved.

BEST MODE OF EMBODYING THE INVENTION

Figure 1:
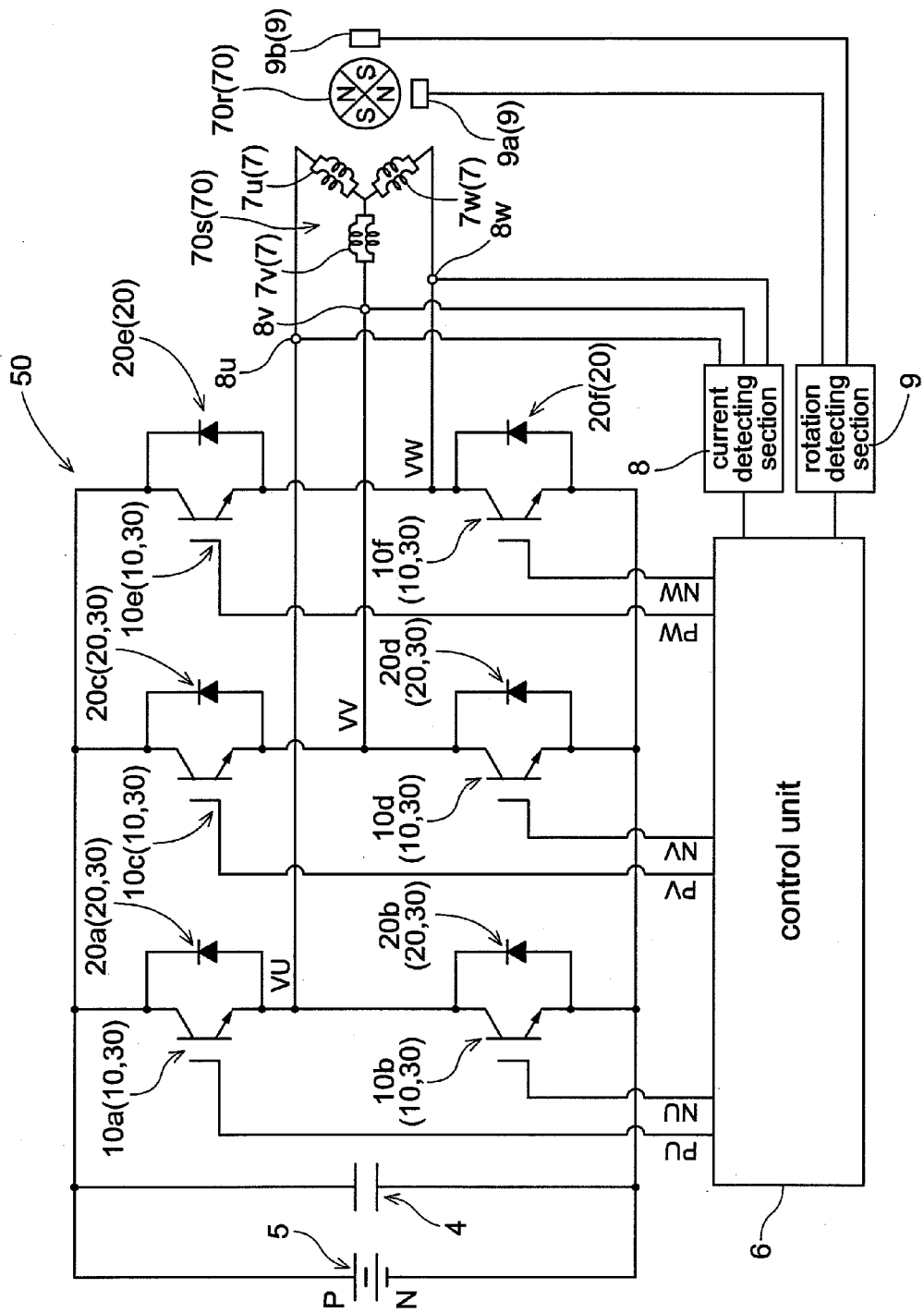
FIG. 1 is a circuit block diagram schematically showing a circuit construction of an inverter.

Next, embodiments of the present invention will be described with reference to the accompanying drawings. FIG. 1 is a circuit block diagram schematically showing construction of a motor drive circuit. This embodiment will be explained, with using, as an example wherein a motor 70 in which a stator 70s has six projecting poles in correspondence with a rotor 70r having four poles (two-pole pairs). The four-pole rotor 70r consists of two pairs of NS pole pairs That is, for an electric angle of 360 degrees at which coils 7 of the stator 70s for providing a rotational magnetic field to the rotor 70r are excited, the rotor 70r is rotated by a mechanical angle of 180 degrees (=360/2). For one total rotation of the rotor 70s, excitation corresponding to the two pairs of NS pole pairs is needed. And, for the coils 7 (7u, 7v,7w) that are excited in the three phases, U phase, V phase and W phase, two lines are needed per phase. And, to these two lines, because of the mechanical angle described above, the coils 7 wound about the projecting poles spaced apart by 180 degrees in the stator 70s correspond. (see FIG. 25 to be described later).

FIG. 1 schematically shows the construction of the motor drive circuit including an inverter 50 ("inverter apparatus") for driving the stator coils (coils 7) in three phases, based upon the above-described operational principle. As shown, on the side of the motor 70, in correspondence with the respective three phases, there are formed three parallel circuits comprised of the two-windings of coils 7. These three parallel circuits are Y-connected (star connected), via one end of each coil 7 forming an electrically neutral point. The other end of each coil 7 is connected to the inverter 50 in correspondence with each phase (U phase, V phase, W phase) of the three phase excitation configuration.

The motor drive circuit includes a control unit 6 comprised of a microprocessor or the like and the inverter 50 constructed with using switching means. The control unit 6 is configured to control rotation of the motor 70, based upon results of detections by a current detecting section 8 and a rotation detecting section 9. More particularly, the control unit 6 adjusts power to be supplied to the motor 70 by controlling the inverter 50. The functions of the current detecting section 8 and the rotation detecting section 9 will be detailed later. The control unit 6 can alternatively be constructed with using a DSP (digital signal processor), an ASSP (application specific standard product), instead of a microprocessor.

The switching means comprise a power semiconductor device such as a bipolar power transistor, a power MOSFET (metal oxide semiconductor field effect transistor), and an IGBT (insulated gate bipolar transistor), an IPS/IPD (intelligent power switch/device), etc. Also, if appropriate, the switching means is constructed of a plurality of flywheel diodes (regenerative diodes) 20 arranged in parallel. In this embodiment, the switching means comprises an IGBT module 10 formed of IGBT's, a power semiconductor module provided in the form of a module together with flywheel diodes 20. Incidentally, the IGBT module 10 also corresponds to the "power semiconductor module 30" as generically defined herein.

The inverter 50 converts a DC voltage supplied from a battery 5 into AC voltages, based upon inverter drive signals (PU, PV, PW, NU, NV, NW) provided from the control unit 6, thus feeding AC drive current to the coils 7. Here, the voltage on the positive side of the battery 5 will be denoted with the mark P and the voltage on the negative side of the battery 5 will be denoted with the mark N, respectively. The inverter 50 includes a capacitor 4 for stabilizing the DC power P-N.

As shown in FIG. 1, the inverter 50 is comprised of a bridge circuit. Between the positive side P and the negative side N of the DC power source, two IGBT modules 10 are connected in series. That is to say, there is formed a serial circuit having a high-side switch on the positive side and a low-side switch on the negative side. This one set of serial circuit is connected in parallel in three lines in correspondence with the U phase, V phase and W phase, thus completing the bridge circuit. The other ends of the stator coils 7$u$, 7$v$, 7$w$ described above are connected to respective connecting points of the high side switches and the low side switches of the respective serial circuits. Namely, the stator coils 7$u$, 7$v$, 7$w$ are impressed with the three-phase drive voltages VU, VV, VW, respectively.

Inverter drive signals PU, PV, PW are signals for driving IGBT modules 10$a$, 10$c$, 10$e$ that are the high-side switches of the U phase, V phase and W phase respectively. Inverter drive signals NU, NV, NW are signals for driving IGBT modules 10$b$, 10$d$, 10$f$ that are the low-side switches of the U phase, V phase and W phase respectively. To each IGBT module 10$a$-10$f$, there is parallel connected a flywheel diode 20$a$-20$f$.

Lines connected from the inverter 50 to the respective stator coils 7$u$, 7$v$, 7$w$ incorporate current sensors 8$u$, 8$v$, 8$w$ functioning respectively as a part of the current detecting section 8 described above. The current sensor 8$u$, 8$v$, 8$w$ detects the three-phase motor current through each stator coil 7. In this embodiment, there has been described a construction wherein the currents of all the three phases are detected. However, the currents flowing through the three phase stator coils 7$u$, 7$v$, 7$w$ are balanced against each other. So, the sum of instantaneous values thereof is zero. Therefore, it is also possible to detect currents of two phases only, and to obtain the current of the other phase by calculation. The control unit 6 calculates a deviation between the current actually flowing through the motor 70 and a target current, and controls the speed and the torque of the motor 70 based thereon.

Further, the motor 70 includes rotation detecting sensors 9$a$, 9$b$ such as resolvers functioning as a portion of the rotation detecting section 9, thus detecting a rotational angle (mechanical angle) of the rotor 70$r$. The rotation detecting sensors 9$a$, 8$b$ are provided and set in correspondence with the number of poles (the number of pole pairs) of the rotor 70$r$, so that the rotational angle of the rotor 70$r$ is converted into an electric angle $\theta$ and a signal corresponding to this electric angle $\theta$ can be outputted also. The control unit 6 calculates the rotational speed (angular velocity $\omega$) of the rotor 70 and the control timing of the inverter 50, based on the rotational angle thus calculated.

Figure 2:
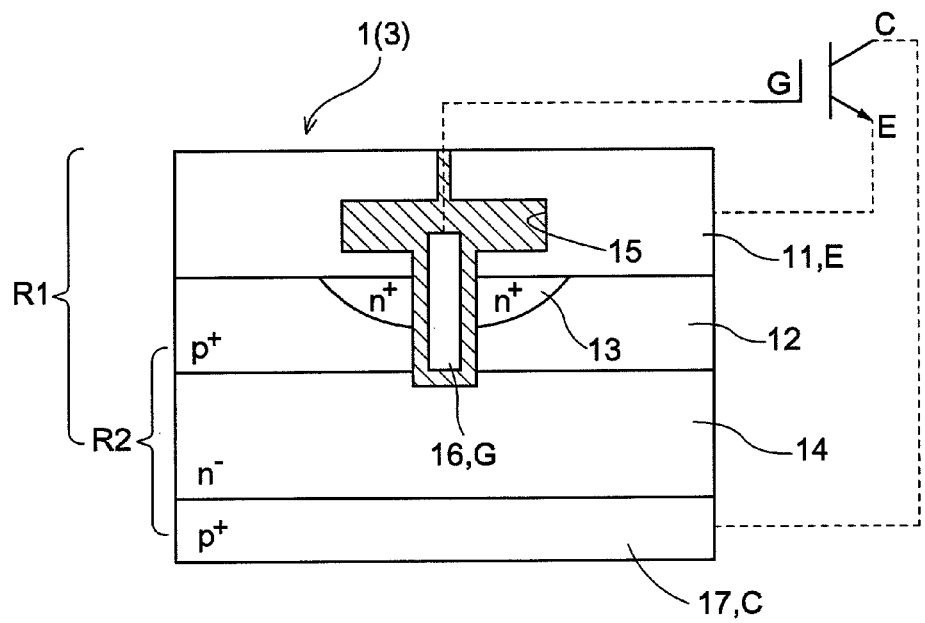
FIG. 2 is a section view schematically showing an example of laminated structure of an IGBT chip.

FIG. 2 is a section view schematically showing an example of laminated structure of an IGBT chip 1 (power semiconductor chip 3) which is to constitute the IGBT module 10 or the power semiconductor module 30 of the inverter 70. IGBT is a power device developed from the MOSFET and has a hybrid construction comprising a MOSFET and a bipolar transistor integrated together.

As shown in FIG. 2, on a P$^+$ type silicon substrate which is to form a collector region 17 (C), an n$^-$ region 14 is formed by e.g. the epitaxial technique. And, on this n$^-$ region 14, a p$^+$ region 12 is formed. In this p$^+$ region 12, an n+ region 13 to form an emitter layer is formed by the diffusion technique. On top of the p$^+$ region 12 and the n$^+$ region 13, there is provided an emitter electrode 11 (E). In this example, through and across the emitter electrode 11 (E), the n$^+$ region 13, the p$^+$ region 12 and the n$^-$ region 14, there is formed a trench 15 provided in the form of a vertical pit. Inside the trench 15, there is provided a gate electrode 16 (G) insulated by an oxide film (SiO$_2$). In this way, the IGBT used in this example has a "trench gate structure". With this structure, it is possible to form a gate circuit in the vertical direction in the figure also. So, the chip area can be significantly reduced.

In FIG. 2, the structure section denoted with a region R1 constitutes a n-channel type MOSFET. That is, the n$^+$ region 13 corresponds the source, the p$^+$ region 12 corresponds to the channel and the n$^-$ region 14 corresponds to the drain, respectively. Under the lower face of the n$^-$ region 14 used as the drain region, there is provided a p$^+$ region 17(C) which is to form the collector region. This structure section denoted with a region R2 and consisting of the p$^+$ region 12, the n$^+$ region 13 and the p$^+$ region (collector region) 17 constitutes a pnp type bipolar transistor. In this way, the IGBT1 has a hybrid structure of a MOSFET and a bipolar transistor.

When a voltage is impressed to the gate electrode 16, electrons are introduced from the emitter (n$^+$ region 13) into the n$^-$ region 14 via the channel formed in the p$^+$ region 12. And, holes are introduced from the collector region 17 (C) as the p$^+$ type silicon substrate to the n$^-$ region 14. With this, like a bipolar transistor, there occurs a conductivity modulation effect within the n$^-$ region 14, which results, in turn, in significant reduction in the device resistance (on-resistance). The MOSFET has the problem of sharp increase in the on-resistance in response to increase in the voltage resistance. However, by using the IGBT construction having a PN junction (the junction between the n$^-$ region 14 and the collector region 17) for hole introduction, this problem can be significantly improved. In the IGBT construction, the p+ region 12 is often called p+ base layer, and the n+ region 14 is called n− base layer, respectively.

Figure 3:
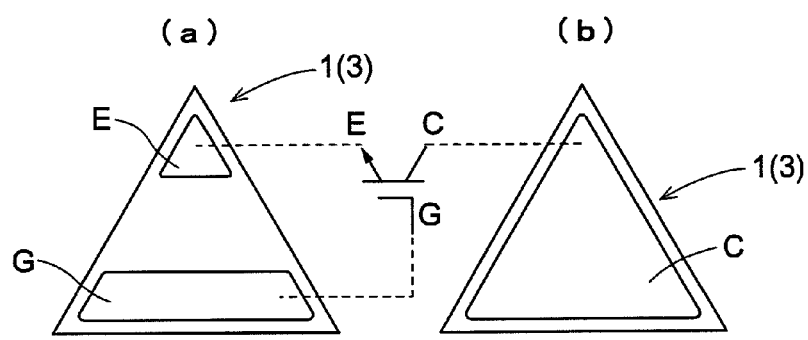
FIG. 3 is an outer appearance view schematically showing an example of the outer appearance of the IGBT chip.

FIG. 3 is an outer appearance view schematically showing an example of the outer appearance of the IGBT chip 1 (power semiconductor chip 3). As shown, the die of the IGBT chip 1 has a surface shape in the form of a regular triangle. FIG. 3(a) is a top plan view showing the appearance of one side of the chip and FIG. 3(b) is a bottom view showing the outer appearance of the other side of the chip. As shown in FIG. 3(a), in the one side, an emitter terminal E is provided at the apex of the regular triangle, and adjacent the opposite side away from and opposite to the apex, a gate terminal G is provided. Further, as shown in FIG. 3(b), in the other side, a collector terminal C is provided over the substantially entire side.

Figure 4:
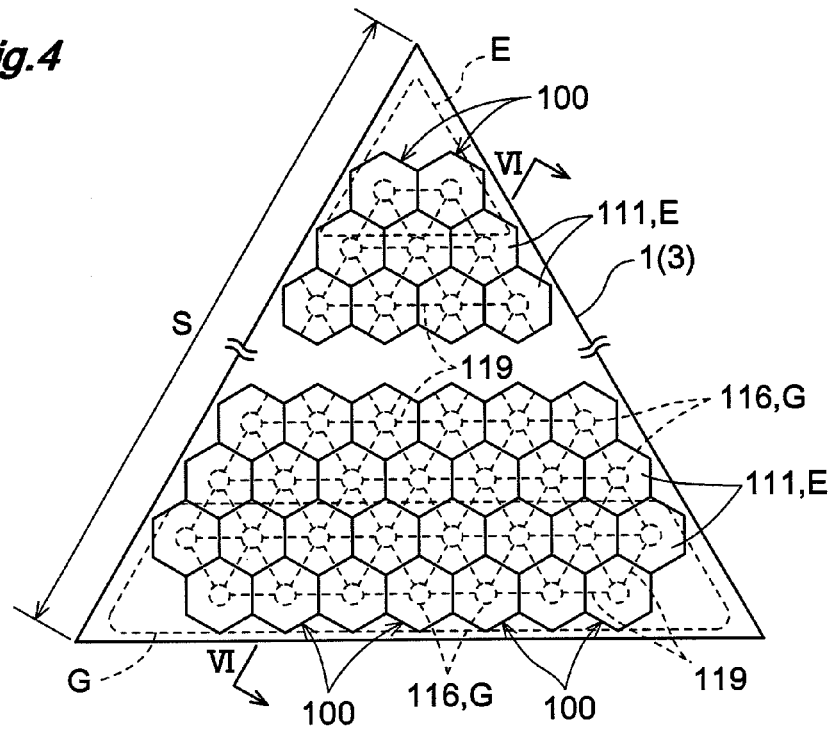
FIG. 4 is a plane view schematically showing an example of an arrangement of integrating cells into the IGBT chip.
Figure 5:
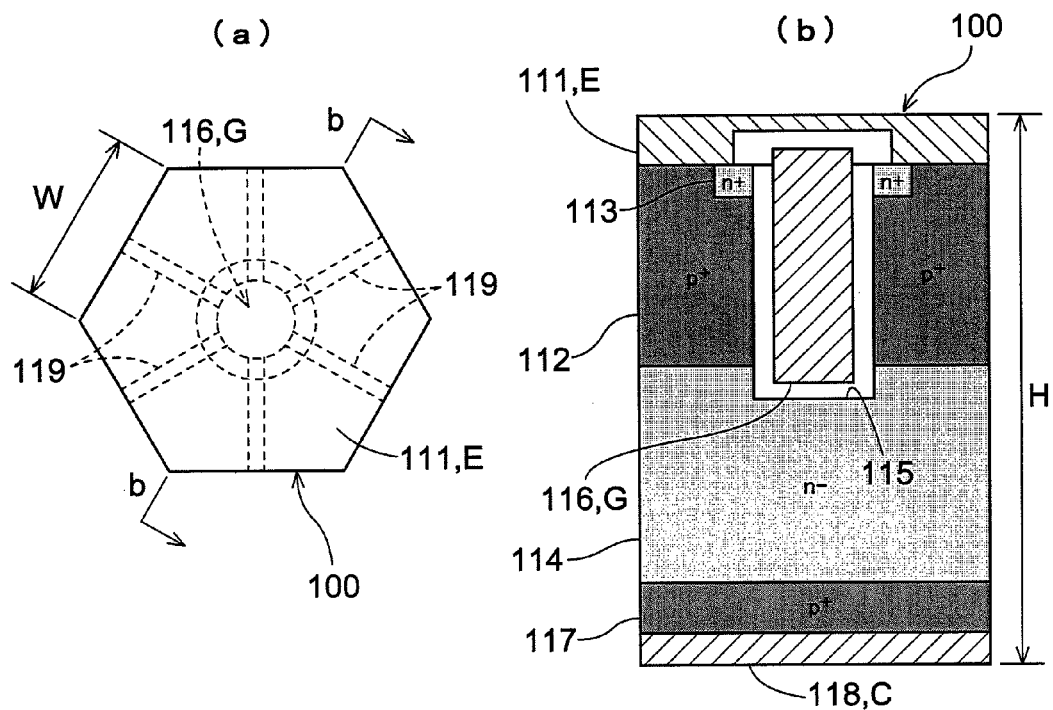
FIG. 5 are section views schematically showing an example of laminated structure of a cell to be integrated into the IGBT chip.
Figure 6:
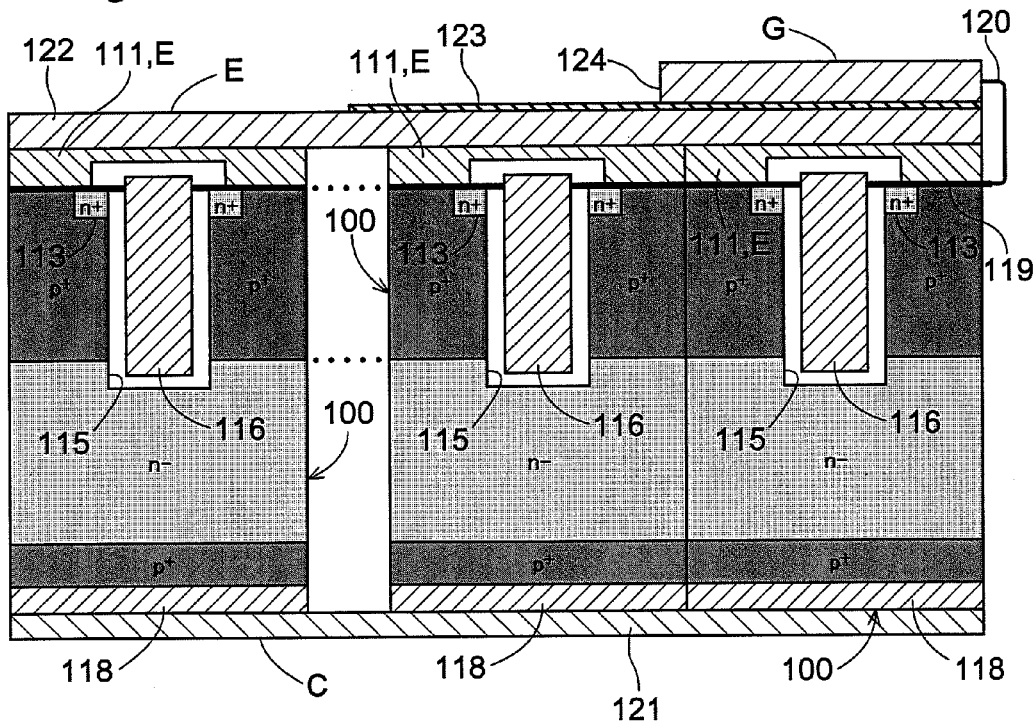
FIG. 6 is a section view schematically showing an example of laminated structure of the IGBT chip shown in FIG. 4.

The IGBT chip 1 is formed by integration of a plurality of cells (numeral 100 to be described later). Now, with reference to FIGS. 4-6, further detailed construction of this cell-integration type IGBT chip 1 will be described. FIG. 4 is a plan view schematically showing an example of an arrangement of integrating cells into the IGBT chip. FIG. 5 is a section view schematically showing a laminated construction of a cell to be integrated into the IGBT chip. FIG. 6 is a section view schematically showing an example of the laminated construction of the IGBT chip shown in FIG. 4.

The IGBT chip 1 is formed by disposing and integrating a plurality of cells 100 (power semiconductor cells) in the zigzag pattern, with each cell 100 comprising a hexagonal cylindrical laminated structure as shown in FIG. 4 and FIG. 5. The respective cells 100 are interconnected via wires or the like, thus together constituting the IGBT chip 1. As shown in FIG. 4, as the respective cells 100 have cross sectional shapes which are congruent regular hexagons, the cells are 100 are packed in the gap-less manner within the IGBT chip 1, thus forming a so-called honeycomb structure. That is to say, the cells 100 are disposed and charged with the highest density possible. As a non-limiting example, one side of the regular triangular IGBT chip 1 has a length S of 10 mm approximately, and one side of the regular hexagonal cell 100 has a length W of 2 μm approximately and the height H of the cell 100 is 100 μm approximately.

As shown in FIG. 5, the laminated structure of the cell 100 is a trench gate structure IGBT that is basically shown in FIG. 2 and similar to the structure described above. Namely, on a p+ silicon substrate to form a collector region 117 (C), an n− region 114 is formed by e.g. the epitaxial technique. And, on this n− region 114, a p+ region 112 is formed and in this p+ region 122, an n+ region 113 to constitute an emitter layer is formed by the diffusion. On top of the p+ region 112 and the n+ region 113, an emitter electrode 111 (E) is provided. Under the collector region 117 (C), a collector electrode 118 (C) is provided. A gate electrode 116 (G) is formed via an insulating layer inside the trench 115 provided in the form of a vertical pit that is completed within a single cell 100. The trench 115 is a vertical pit that extends through the n+ region 113, the p+ region 112 to eventually reach the n− region 14.

Many of the known IGBT trenches having the trench gate structure have a "groove configuration" that extends in the horizontal direction, rather than the configuration of the vertical pit that is completed within or does not extend beyond a single cell 100 as in the present embodiment. Regarding the trench gate structure having the horizontal groove configuration, disclosures relevant thereto are found in abundant documents. An example thereof is shown in FIG. 5 of "*Power Devices for Automotive Applications-Review of Technologies for Low Power Dissipation and High Ruggedness-*", Tsutomu Uesugi, R&D Review of Toyota Central R&D Lab.) Vol. 35 No. 2 (2006, 6). By forming the trench gate structure not as the horizontal groove configuration but the vertical pit configuration, it becomes possible to secure a larger area for the emitter electrode 111 (E) as shown in FIG. 5. Originally, in a gate structure, a gate circuit can be formed in the vertical direction in the figure also. So, this is a structure that allows reduction in the chip area. Moreover, by forming the trench gate as the vertical pit-like construction as proposed by the present invention, the area in the emitter electrode 111 (E) to be reserved for the gate electrode 116 (G) is restricted, so that it becomes possible to secure a correspondingly larger area for the emitter electrode E. As a result, it becomes possible to secure a high current capacity, while reducing the area of the cell 100 and the area of the IGBT chip 1.

The gate electrode 116 (G) is connected to a gate wire 119 provided in the inner layer to be electrically communicated with the gate electrode 116 (G) of an adjacent cell 100. Therefore, although the gate electrode 116 (G) is not exposed, through a horizontal groove structure, on the surface of the cell 100, the connection with the gate electrode G of the adjacent cell 100 is ensured. As the current flowing in the gate electrode G is much smaller than the current flowing through the emitter electrode E, the gate wire 119 provided in the inner layer is sufficient for the connection between the gate electrodes 116 (G) of the cells 100.

Incidentally, in providing the gate wire 119 in the inner layer of the cell 100, it is advantageous if a gate resistor having a resistance value according to the positional relationship with the gate electrode 116(G) of the cell 100 and the gate electrode G of the IGBT chip 1 (see FIG. 3 and FIG. 4) is added to each cell 100. By providing the gate electrode 116 (G) of each cell 100 with a gate resistor in accordance with the distance of the wire to the gate terminal G of the IGBT chip 1, it becomes possible to render uniform the propagation delays of the drive signals from the gate terminal G to the gate electrodes 126 of the respective cells 100. As a result, the IGBT chip 1 can operate in a stable manner.

From the foregoing explanation, it will be clearly understood that the cell 100 should satisfy such conditions of the possibility of being disposed with minimal gap within the IGBT chip 1, the availability of the vertical pit-like trench gate structure, the uniformity of the gate wire lengths from the gate electrodes 116 (G) of the respective cells C, etc. Therefore, in the above, as a most preferred mode of embodiment, there has been explained the exemplary construction of the cell 100 comprising a regular hexagon. However, though at the cost of certain reduction in the disposing density, in the present invention, the shape of the cell 100 can also be any other regular polygon (e.g. a right octagonal column) or a circular column. A plurality of such cells packed or stacked in the form of such right polygonal column or a circular column can be arranged in the zigzag pattern and interconnected respectively via wires or the like. In these alternative cases, i.e. the cell 100 comprising other right polygonal column or circular column, too, the requirements of the availability of the vertical pit-like trench gate structure, the uniformity of the gate wire lengths from the gate electrodesd 116 (G) of the respective cells 110 can still be met sufficiently.

As shown in FIG. 3, FIG. 4 and FIG. 6, at the apex of the regular triangular shape of one side of the IGBT chip 1 whose die has the regular triangular surface shape, the emitter terminal E is provided and the gate terminal G is provided adjacent the opposite side opposite to and away from the apex. As shown in FIG. 5 and FIG. 6, as the emitter electrode 111 (E) is exposed on the surface of the cell 100, an emitter electrode layer 112 (E) is formed in such a manner as to cover the emitter electrode 111 (E) of each cell 100. In the emitter electrode 111 (E), a large current flows. However, as the emitter electrode layer 112 is formed over the substantially entire surface, it is possible to restrict local concentration of the current, thus enabling the emitter electrode E to have a lower impedance. Further, as shown in FIG. 5 and FIG. 6, since the collector electrode 118 (C) is exposed on the surface of the cell 100, similarly to the above, a collector electrode layer 121 (G) is formed in such a manner as to cover the collector electrode 118 (C) of each cell 100. Hence, for the collector electrode C also, this can be of a lower impedance with effective restriction of local concentration of current.

On top of the emitter electrode layer 112, an insulating layer 123 is formed and on top of this insulating layer 123, a gate electrode layer 124 (G) is formed. The gate electrode layer 124 (G) is connected via a gate wire 120 with the gate wire 119 connected in the inner layer of each cell 100. FIG. 6 is a section view schematically showing the respective electrodes of the IGBT chip 1 and the layout of the cells 100, so specific construction of the gate wires 120 is not shown therein. As may be clearly understood from e.g. FIG. 4, the IGBT chip 1 includes a peripheral region where no cells 100 are disposed. So, the gate wires 120 can be formed in such peripheral area free from the cells 100, by any known technique appropriately.

Figure 7:
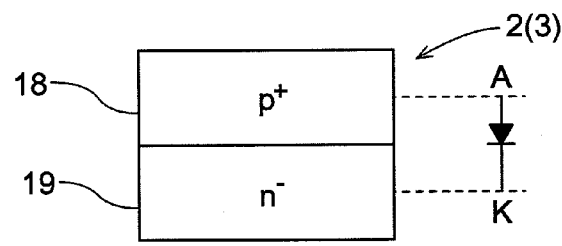
FIG. 7 is a section view schematically showing an example of laminated structure of a diode chip.
Figure 8:
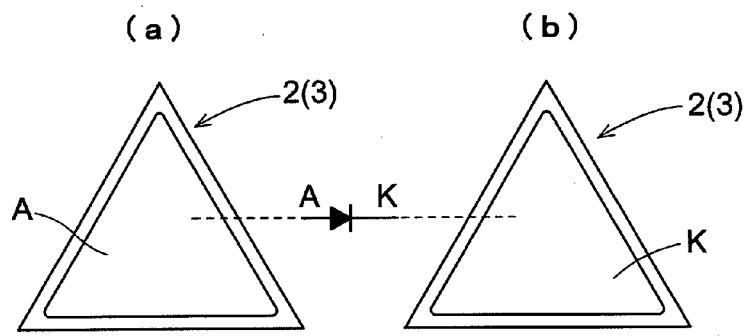
FIG. 8 are outer appearance views schematically showing an example of the outer appearance of the diode chip.

FIG. 7 is a section view schematically showing an example of laminated structure of a diode chip 2 (power semiconductor chip 3) constituting the flywheel diode 20. And, FIG. 8 is an outer appearance view schematically showing an example of the outer appearance of the diode chip 2. As shown in FIG. 7, the diode chip 2 consists of a p$^+$ region 18 and an n$^-$ region 19. The p$^+$ region 18 constitutes the anode and the n$^-$ region 19 constitutes the cathode. Here, the structure shown simulates a laminated type structure; however, various other types of structure such as a planar type, a mesa type, can be employed also.

Further, as shown in FIG. 8, the surface shape of the die of the diode chip 2 is also a regular triangle. FIG. 8(a) is a top plan view showing the outer appearance of one side of the chip and FIG. 8(b) is a bottom view showing the outer appearance of the other side of the chip. As shown in FIG. 8(a), on the one face, over substantially entire area of the regular triangle, an anode terminal A is provided. Further, as shown in FIG. 8(b), on the other face, over substantially entire area thereof, a cathode terminal K is provided. The diode chip 2 too is comprised of integration of a number of cells. The details thereof are same as those of the IGBT chip described above with reference to FIGS. 6-6, and therefore, will not be given again here.

As described above, the IGBT chip 1 and the diode chip 2 as power semiconductor chips 3 have regular triangular die (chip) shapes. Since a wafer is circular in shape, a greater number of such regular triangular dies can be cut therefrom, as compared with the case of cutting the conventional square or rectangular dies. Hence, the wafer can be used more efficiently.

The diode chip 2 is used as a "flywheel diode". So, it is desired that this chip has a high voltage resistance and a voltage drop thereof should range within 1 V even when a large current flows therethrough. Further, it is also desired that the diode chip 2 should have a high speed response capable of following high-speed switching of the IGBT and also a soft-recovery performance as will be described below.

A flywheel diode is under a forward bias state during OFF state of the IGBT, thus allowing reflux of the energy accumulated in an inductive load (coil 7). When the IGBT is rendered again into the ON state, the flywheel diode is switched from the forward bias state to the reverse bias state. In this case, a reverse current called "reverse recovery current" flows in the flywheel diode, and the current eventually becomes zero. If this change of the reverse recovery current is sharp, there will be generated a surge voltage often called a "flywheel noise". And, this surge voltage becomes a radiant noise, which can sometimes affect adversely the various circuits or even destroy the switching devices such as the IGBT. Therefore, it is desired that the change of the reverse recovery current should occur gently (softly), and the soft recovery performance capable of restricting generation of such surge voltage should be high. On the other hand, it is also needed for the diode to be capable of following the high-speed switching of the IGBT or the like, and reducing the reverse recovery current at a high speed. That is to say, it is desired that residual load(electric charge) at the time of voltage application in the forward direction should be minimal.

Figure 9:
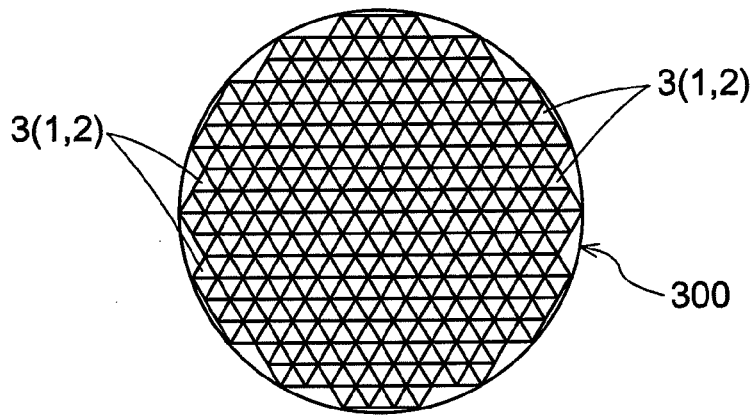
FIG. 9 is a top plane view schematically showing a wafer on which power semiconductor chips are to be formed.

The power semiconductor chips 3 (the IGBT chips 1 and the diode chips 2) having the regular triangular die (chip) shape are formed in the honeycomb arrangement on the wafer 300, as shown in FIG. 9. Since the wafer has a circular shape, a greater number of regular triangular dies can be cut therefrom, compared with the case of cutting the conventional square or rectangular dies. As a result, more efficient use of the wafer is made possible. That is to say, in the case of the regular triangular shape, dies can be cut with a higher cutting plan efficiency. The details thereof will be explained next with reference to FIGS. 10-12.

Figure 10:
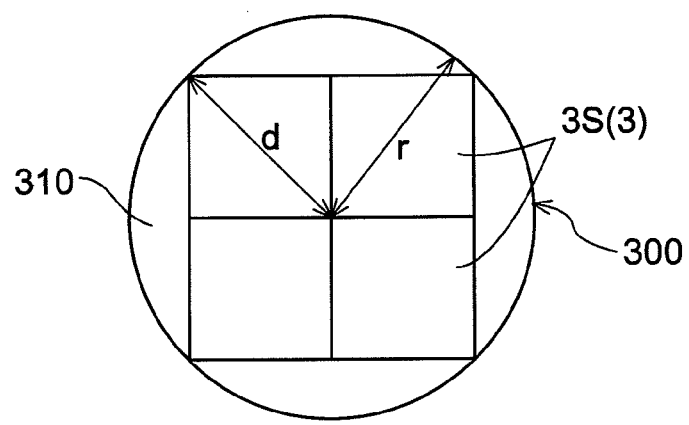
FIG. 10 is an explanatory view of a cutting plan efficiency of power semiconductor chips.
Figure 11:
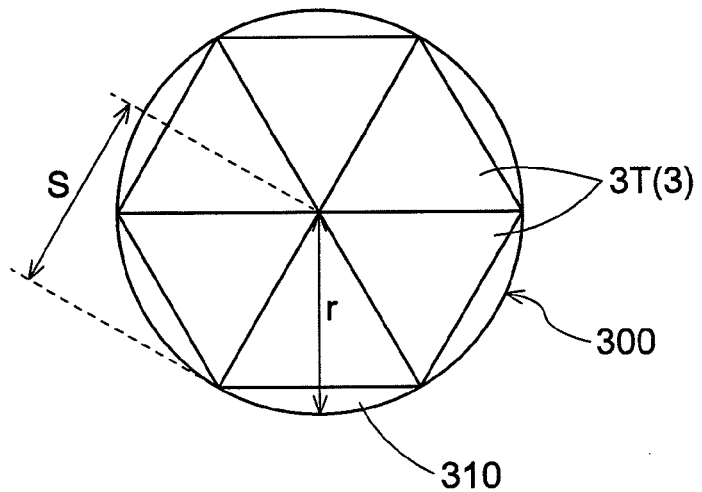
FIG. 11 is an explanatory view of a cutting plan efficiency of power semiconductor chips.

FIG. 10 is an explanatory view for explaining the cutting plan efficiency of the conventional square-shaped chips 3S (3). In FIG. 10, the length of the diagonal line of the squire chip 3S is d and the radius of the water 300 is r, and d=r. FIG. 11 is an explanatory view of a cutting plan efficiency of power semiconductor chips. In FIG. 11, the length of one side of the chip 3T is S, the radius of the wafer 300 is r, and S=r. In FIG. 10 and FIG. 11, the region 310 where no chips 3S and 3T are formed at all are the substrate region to be discarded.

The area of the wafer 300 is $\pi r^2$, with the circular constant being $\pi(\approx 3.14)$. The area occupied by the square chips 3S in the wafer 300 is given as $2d^2$. Since r=d, the effective cutting ratio which is the ratio occupied by the squire chips 3S in the wafer 300 is given by:

$$\frac{2}{\pi} \approx 0.6366 \qquad (1)$$

Whereas, the area occupied by regular triangular chips 3T in the wafer 300 is given by:

$$\frac{3}{2}\sqrt{3}\,S^2 \qquad (2)$$

Since r=S, the effective cutting ratio which is the ratio occupied by the regular triangular chips 3T in the wafer 300 is given by:

$$\frac{3}{2\pi}\sqrt{3} \approx 0.8270 \qquad (3)$$

As shown above, die cutting with higher cutting plan efficiency is possible in the case of the regular triangles.

The area of the squire chips 3S shown in FIG. 10 and the area of the regular triangular chips 3T shown in FIG. 11 are given respectively by the following formulae (4), (5).

$$\frac{1}{2}r^2 = 0.5r^2, \qquad (4)$$

$$\frac{\sqrt{3}}{4}r^2 \approx 0.43r^2 \qquad (5)$$

Although the area of the regular triangular chip 3T is about 14% smaller than the area of the square chip 3S, the cutting ratio is improved by about 30% in the case of the former over the latter.

Figure 12:
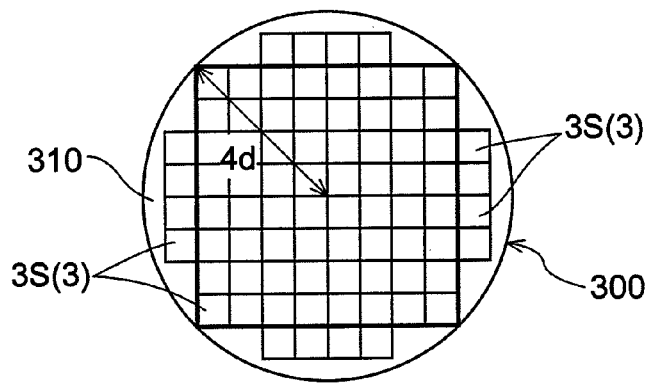
FIG. 12 is an explanatory view of a cutting plan efficiency of power semiconductor chips.

Incidentally, if a large-diameter wafer 300, i.e. a wafer having a sufficiently large diameter relative to the cell 100 is employed, the effective cutting plan efficiency will be improved. For instance, as shown in FIG. 12, let us suppose that like FIG. 10, square chips 3S having a diagonal line length d are formed on the wafer 300 having a radius 4d. The area of the wafer 300 is given as $16\pi d^2$. The area occupied by the square chips 3S in the wafer 300 is given by:

$$\{2\times(4d)^2\}+(4\times 2d^2)=40d^2 \qquad (6)$$

The effective cutting plan ratio is given by $$\frac{40}{16\pi} \approx 0.7958 \qquad (7)$$

In this way, as may be clearly understood from the fact that the result value (7) is greater than the result value (1), the effective cutting plan ratio can be enhanced by increasing the diameter of the wafer 300. However, even in the case of (7), the value does not exceed the effective cutting plan ratio for the regular triangular chip 3T. Also, when the diameter of the wafer 300 is increased, it becomes possible to form also the regular triangular chips 3T in the waste substrate region 310, whereby the effective cutting plan ratio of the regular triangular chip 3T will be further increased.

As described above, the regular triangular chip 3T has the advantageous shape characteristics that allows high effective cutting plan ratio, even when the diameter of the wafer 300 is small. Further, when a large-diameter wafer 300 is employed, this will necessitate enlargement of all of the peripheral apparatuses and machines relating to the manufacture of semiconductors, thus imposing high system investment cost burden. Whereas, in the case of the regular triangular chip 3T which does not require any large-diameter wafer 300, the system investment cost can be restricted.

Figure 13:
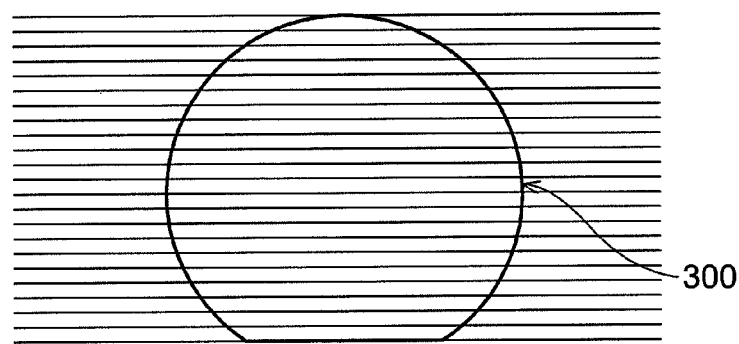
FIG. 13 is an explanatory view of a cutting plan of power semiconductor chips having regular triangular shape.
Figure 14:
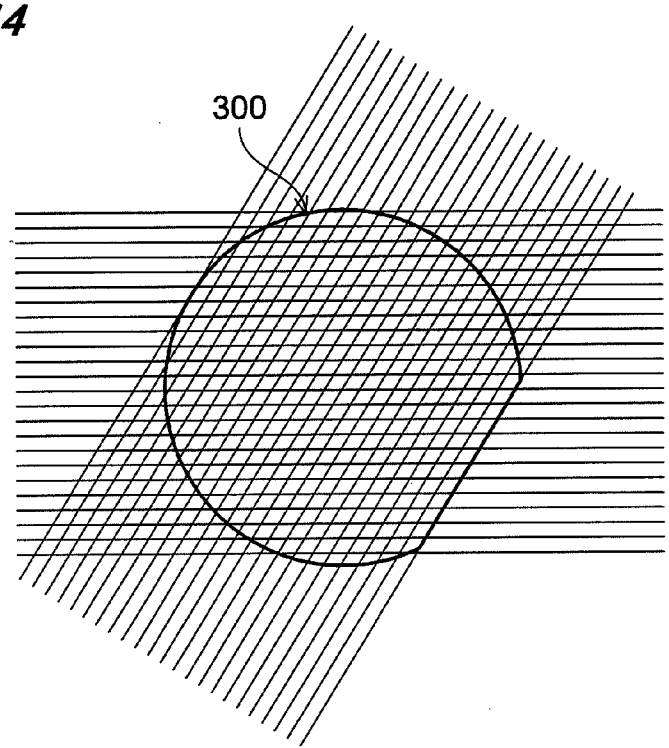
FIG. 14 is an explanatory view of a cutting plan of power semiconductor chips having regular triangular shape.
Figure 15:
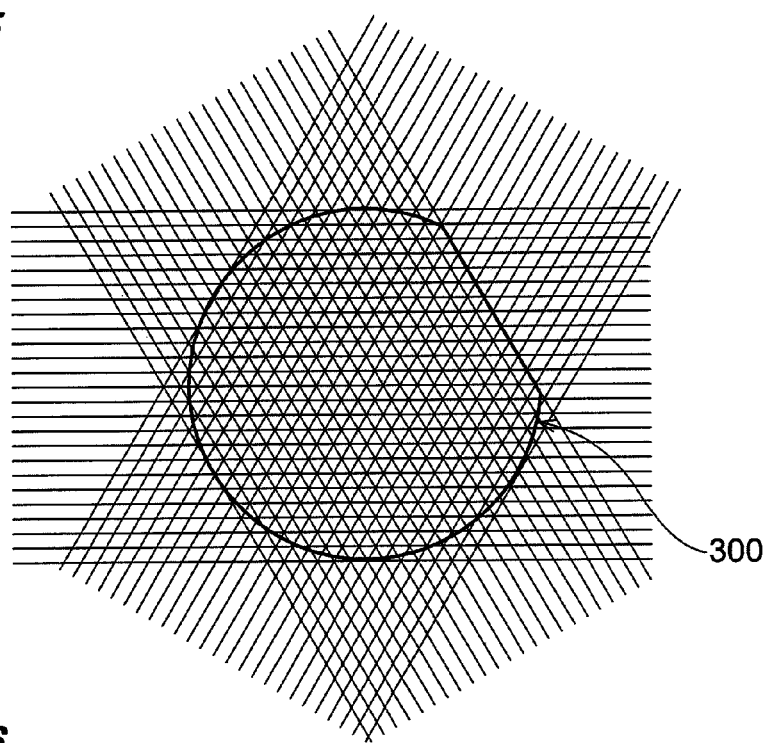
FIG. 15 is an explanatory view of a cutting plan of power semiconductor chips having regular triangular shape.

The power semiconductor chips 3 formed in the honeycomb pattern on the wafer 300 are cut in the manner illustrated in FIGS. 13-15. Prior to cutting, an integrated circuit will be formed as described below. Ingot of silicon crystal has a cylindrical shape which has been chamfered by e.g. a diamond cutter in order to increase its circularity. Semiconductor such as silicon has an "orientation" in terms of its crystalline structure. In order to determine a reference for that "orientation", an end face of the ingot is cut off by means of polishing or the like to provide a reference face. Then, from this ingot, a wafer 300 will be thinly sliced with using e.g. a band saw. The cut wafer 300 will then be subjected to a mirror finish treatment and cleaned with pure water. The resultant wafer 300 will then be subjected to various known semiconductor manufacturing steps such as photosensitization with photo resist, stepper, etching, ion doping, sputtering, cleaning, etc, whereby power semiconductor circuits such as IGBT, diodes, etc. are formed in the wafer 300. Then, with using a dicing machine, the regular triangular semiconductor chips 3 will be cut from the wafer.

A square-shaped chips can be cut by cutting operations along two directions perpendicular to each other. Whereas, cutting of the regular triangular power semiconductor chip 3 requires cutting operations along three directions to be described below. Firstly, with using a dicing machine such as a diamond cutter, the wafer 300 will be cut horizontally (0 degree) relative to the reference face described above. Then, as the dicing machine is moved in translation, the entire wafer 300 will be cut parallel to the reference face (FIG. 13). Next, the wafer 300 will be rotated 60 degrees either clockwise or counter clockwise, and the wafer 300 will be cut similarly (FIG. 14). Subsequently, the wafer will be further rotated for additional 60 degrees, and then will be cut similarly (FIG. 15). With these, the wafer 300 will be separated into a plurality of regular triangular power semiconductor chips 3.

Semiconductor such as silicon has a diamond structure and its crystal has the characteristics called "cleavage crack" of being easily cracked along a predetermined plane. For instance, a crystal called the lattice structure [1, 0, 0] has superior electric characteristics, yet this is an orthogonal lattice. For this reason, if a cutting is effected in the direction rotated 60 degrees or 120 degrees from the reference face, this will result in formation of a crack along the cleavage plane, so that there is the possibility of cut line being formed jagged or stepped. In this case, in order to avoid adverse effect on the circuit of the power semiconductor chip, advantageously, the circuits can be formed on the wafer 300, with securing a sufficient margin between adjacent power semiconductor chips 3.

However, for the sake of efficient use of the wafer 300, it is not desirable to provide much margin on the wafer 300 in view of the possibility of such jagged or stepped cut line being formed. The crystal of the lattice structure [1, 1, 1], though being inferior to the crystal of the lattice structure [1, 0, 0] in the respect of the electrical characteristics, is a crystal having the "cleavage characteristics" in the direction of 60 degrees and the direction of 120 degrees. Then, preferably, the circuit of the power semiconductor chip 3 is formed on the wafer having the lattice structure [1, 1, 1].

Figure 16:
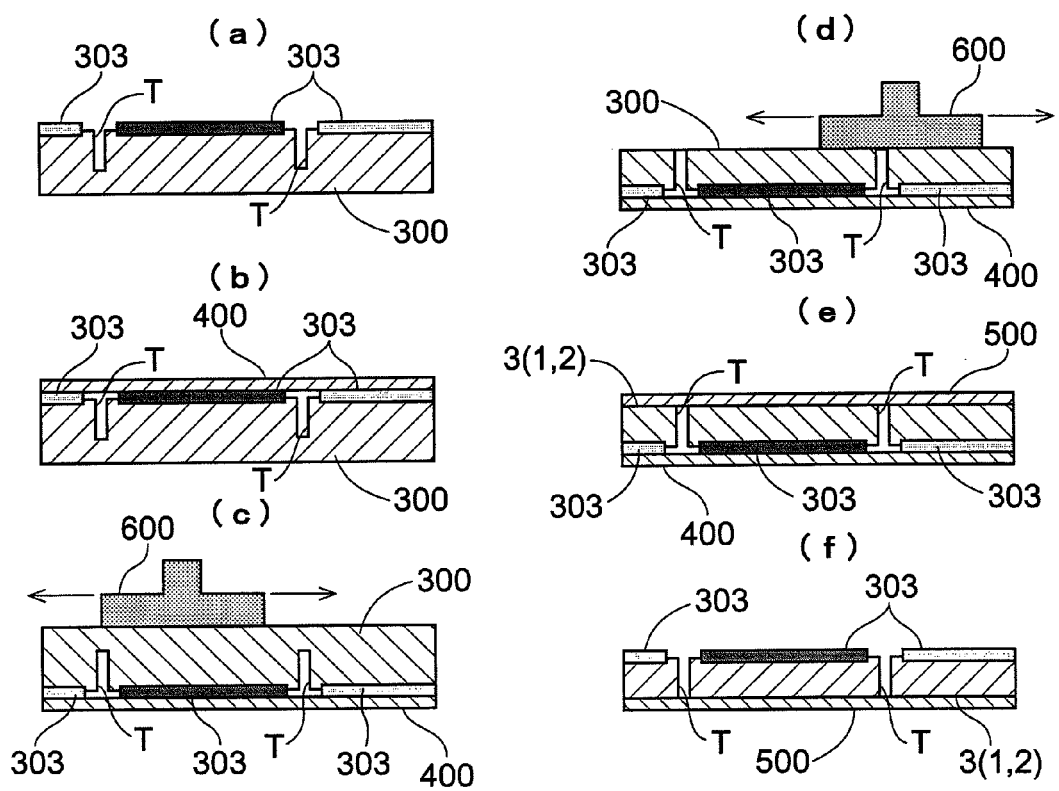
FIG. 16 are explanatory views of dicing of a power semiconductor.

As has been described above with reference to FIGS. 13-15, after cut lines have been formed in the wafer 300, a dicing operation for cutting individual power semiconductor chips 3 will be effected. Next, this dicing operation will be described with reference to FIG. 16. FIG. 16 shows sections of the wafer 300. In FIG. 16, numeral 303 denotes an integrated circuit of the power semiconductor chip 3 formed on the wafer 300. Mark T denotes cut lines what have been described with reference to FIGS. 13-15. As may be understood from FIG. 16(a) for instance, the cut lines T do not extend or penetrate through the wafer 300, so the respective power semiconductor chips 3 are not yet completely separated from the wafer 300. Here, the side of the wafer 300 on which the integrated circuit is formed, that is, the cut lines have been formed, will be referred to as the "front face" and the other side to which the cut lines do not reach will be referred to as the "back face", respectively hereinafter.

As shown in FIG. 16(b), on the front face of the wafer 300, a front face protective sheet 400 will be affixed. Then, as shown in FIG. 16(c), the back face of the wafer 300 will be polished by a polishing machine 600. This polishing operation will be effected until the cut line groove T becomes exposed on the side of the back face of the wafer 300. When the cut line groove T has reached the back face of the wafer 300, the power semiconductor chips 3 will become individual chips. At this point, the front face protective sheet 400 remains affixed to the front face of the wafer 300, so the individual power semiconductor chips 3 are still connected to each other via this front face protective sheet 400. Then, as shown in FIG. 16(*e*), a back face protective sheet 500 will be affixed to the back face. Then, as shown in FIG. 16(*f*), the front face protective sheet 400 will be removed. With this, the individual power semiconductor chips 3 are separated from the wafer 300, but remain connected to each other via the back face protective sheet 500.

In this way, the power semiconductor chips 3 cut from the wafer 300 will be picked one by one by a vacuum tweezers device and then packaged. In this embodiment, as will be described below, there will be described an exemplary case where a plurality of power semiconductor chips 3 are combined together to form a power transistor module 30.

Figure 17:
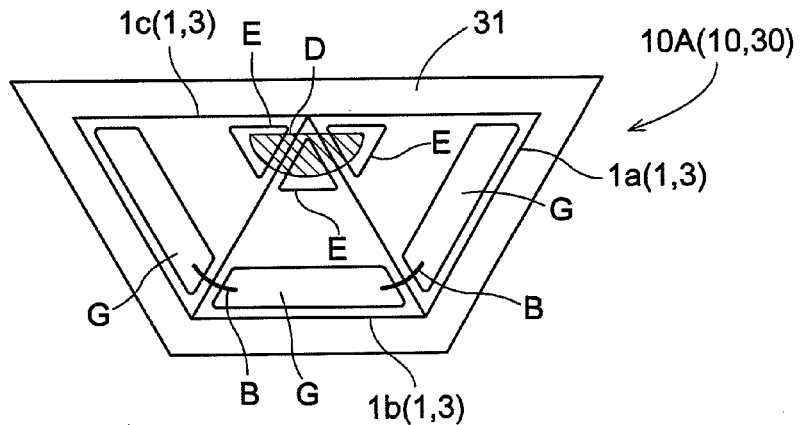
FIG. 17 is a top plan view schematically showing an example of an IGBT module construction.

FIG. 17 is a top plan view schematically showing an example of construction of an IGBT module 10. In this example, the IGBT module 10A (power semiconductor module 30) is formed by interconnecting three IGBT chips 1 (1*a*, 1*b*, 1*c*) in parallel. The IGBT chip 1 or a diode chip 2 has a size of one side thereof ranging from 5 mm to 10 mm approximately, for instance. By interconnecting a plurality of chips in parallel, the current capacity is increased and also the on-resistance of the IGBT module 10 is kept low.

As has been described with reference to FIG. 3, the emitter terminal E of the IGBT chip 1 is disposed at the apex of the regular triangular chip. As shown in FIG. 17, the IGBT module 10A is formed with the emitter terminals E being connected in the form of equilateral trapezoidal shape with the apices thereof being in abutment against each other. For the emitter terminals E concentrated at the one location, an electrode D in electric conduction with all of the three chips as shown in FIG. 13 will be formed by vapor deposition, whereby the electrode D will be formed into a common terminal. Alternatively, the respective emitter terminals E can be interconnected by means of wire bonding or soldering technique.

If the short side of the parallel sides of the equilateral trapezoid is defined as the "upper side", then, the gate terminals G are disposed adjacent the outer peripheral sides extending between the two leg portions and the upper side. The gate terminals G of the adjacent IGBT chips 1*a*, 1*b* and the gate terminals G of the further adjacent IGBT chips 1*b*, 1*c* are connected respectively by wire bondings B, whereby the gate terminals G are rendered into a common gate terminal of the IGBT module 10A.

The IGBT chips 1*a*, 1*b*, 1*c* are mounted on a trapezoidal copper plate 31, by soldering the collector terminals C provided on the back sides of the chips with using high melting point solder 32. Preferably, the copper plate 31 is a nickel-plated copper plate 31 or a copper plate 31 allowing soldering. As described above, since the collector terminal C is provided over substantially entire lower face of the chip, the contact resistance is low so that a large current can be conducted effectively. Further, as the IGBT chip 1 through which a large current flows is placed in contact over a large area with the copper plate 31, heat resistance associated with the copper plate mounting of the IGBT chip 1 is reduced, thus improving the heat discharging performance.

Figure 18:
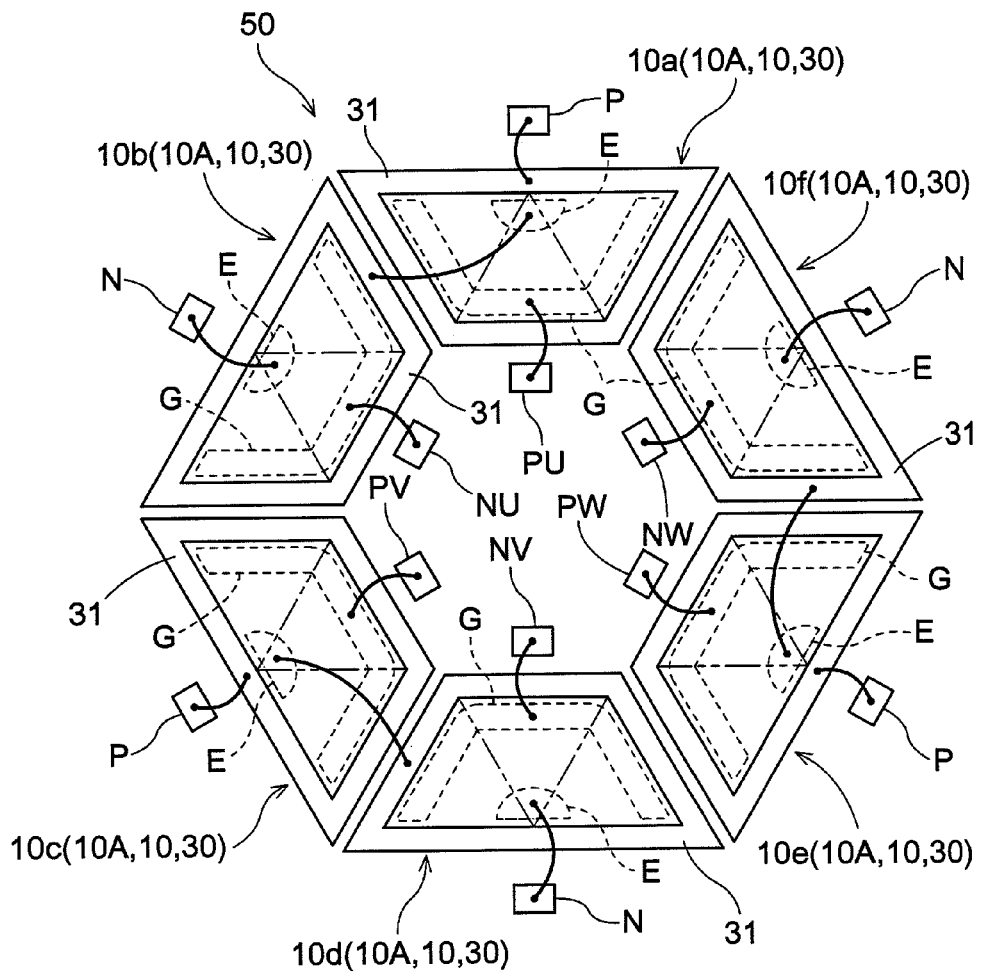
FIG. 18 is an explanatory view schematically showing an example of construction of an inverter using the IGBT module show in FIG. 17.

FIG. 18 is an explanatory view showing an example of inverter construction using the IGBT module 10A shown in FIG. 17. The inverter 50 includes six power semiconductor modules 10A arranged in a hexagonal layout, into a ring-like configuration. In FIG. 18, IGBT module 10*a* (10A) functions as a high side switch for U phase, IGBT module 10*b* (10A) functions as a low side switch for U phase, IGBT module 10*c* (10A) functions as a high side switch for V phase, IGBT module 10*d* (10A) functions as a low side switch for V phase, IGBT module 10*e* (10A) functions as a high side switch for W phase, IGBT module 10*f* (10A) functions as a low side switch for W phase.

As shown also in the circuit block diagram of FIG. 1, the copper plate 31 conductive to the collector terminal C of the IGBT module 10*a* is connected to the positive side P of the DC power source. To the gate terminal G of the IGBT module 10*a*, there is connected an inverter drive signal PU from the control unit 6. The emitter terminal E of the IGBT module 10*a* is connected to the copper plate 31 conductive to the collector terminal C of the IGBT module 10*b* disposed adjacent thereto. To the gate terminal G of the IGBT module 10*b*, there is connected an inverter drive signal NU from the control unit 6. The emitter terminal E of the IGBT module 10*b* is connected to the negative side N of the DC power source. That is to say, between the positive side P and the negative side N of the DC power source, a serial circuit comprising the two IGBT modules 10 is formed in correspondence with the U phase.

Similarly to the above, a serial circuit comprising the IGBT modules 10*c* and 10*d* is formed in correspondence with the V phase. And, a serial circuit comprising the IGBT modules 10*e* and 10*f* is formed in correspondence with the W phase. In the exemplary construction shown in FIG. 18, the flywheel diodes 20 using the diode chips 2 are eliminated.

Incidentally, in FIG. 3(*a*), the IGBT chip 1 can be formed with disposing the emitter terminal E and the gate terminal G in reverse. However, as may be apparent form the foregoing explanation with reference to FIGS. 17-18, in this case, the emitter terminals of the IGBT modules 10 flowing large current will be dispersed over a wide area. As a result, the length of the wires interconnecting the emitter terminals E will be elongated, thus leading to increase of the impedance (especially, inductance). Further, there will occur greater irregularity in the impedance characteristics of the respective IGBT modules 10 (power semiconductor modules 30). As a large current flows through the emitter terminal E, the effect of such problem relating to impedance to the stable control of the motor 70 will not be negligible.

On the other hand, with use of the terminal arrangement of the IGBT chips 1 as shown in FIG. 3(*a*), advantageous reduction in the lengths of the wires can be realized in case the IGBT module 10 is formed by multi-wire bonding. Further, with this length or distance reduction, wiring inductance and impedance such as wiring resistance can be reduced.

Figure 19:
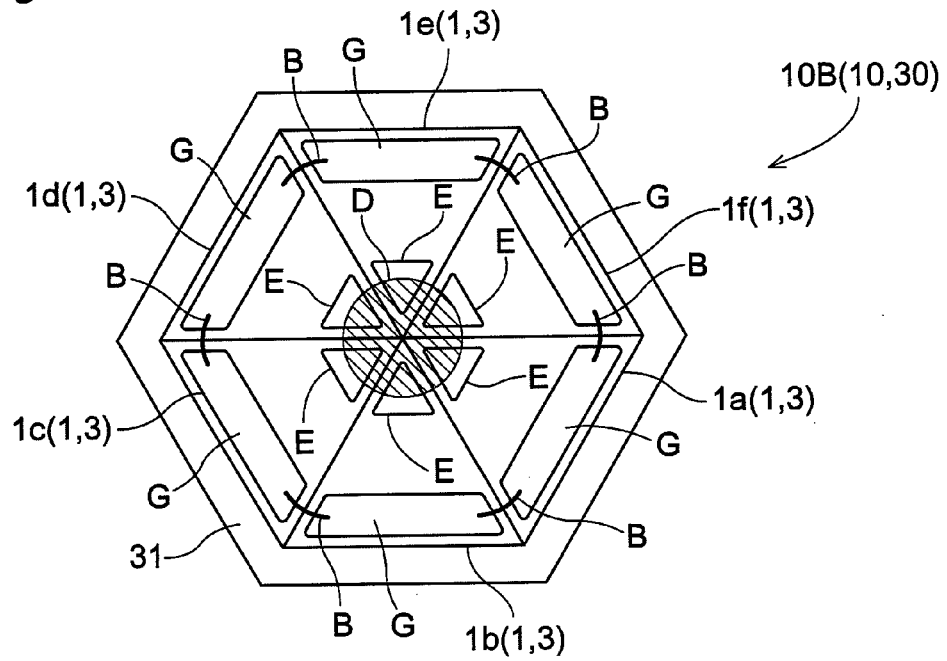
FIG. 19 is a top plan view schematically showing an example of construction extended from the IGBT module shown in FIG. 17.

In the case of the example shown in FIG. 17, the IGBT module 10 (10A) is formed by connecting three IGBT chips 1 in parallel. However, since the IGBT chip 1 has a regular triangular shape, modules of various other shapes can be readily extended therefrom as desired. FIG. 19 is a top plan view schematically showing an example of the construction of such extended IGBT module 10B alternatively extended from the IGBT module 10A shown in FIG. 17. As shown in FIG. 19, six regular triangular IGBT chips 1 (1*a*-1*f*) are connected to each other to form a regular hexagonal IGBT module 10B.

As described hereinbefore with reference to FIG. 3, the emitter terminal E of the IGBT chip 1 is disposed at the apex of the regular triangular chip. Similarly to the construction shown in FIG. 17, as shown in FIG. 19, the IGBT module 10B is formed by placing the apices where the emitter terminals E are disposed into abutment with each other. In this example, six IGBT chips 1 together form the regular hexagonal IGBT module 10B. The emitter terminals E are concentrated at the center of the regular hexagon and rendered into a common terminal by vapor deposition of an electrode E commonly conductive to all the three chips as shown in FIG. 19. Needless to say, alternatively, the emitter terminals E can be interconnected by means of wire bonding, soldering etc.

The gate terminals G, as shown in FIG. 19, are disposed along the outer periphery of the regular hexagon. The gate terminals G of adjacent IGBT chips are connected via wire bondings B respectively to be formed into a common gate terminal of the IGBT module 10B.

The IGBT chips 1a-1f are soldered onto the regular hexagonal copper plates 31 and the collector terminals C on the lower faces of the chips are soldered with using high melting point solder 32. In this way, when the IGBT chip 1 has a regular triangular shape, the IGBT module 10 can be configured flexibly, in accordance with the current capacity required by the inverter 50.

Figure 20:
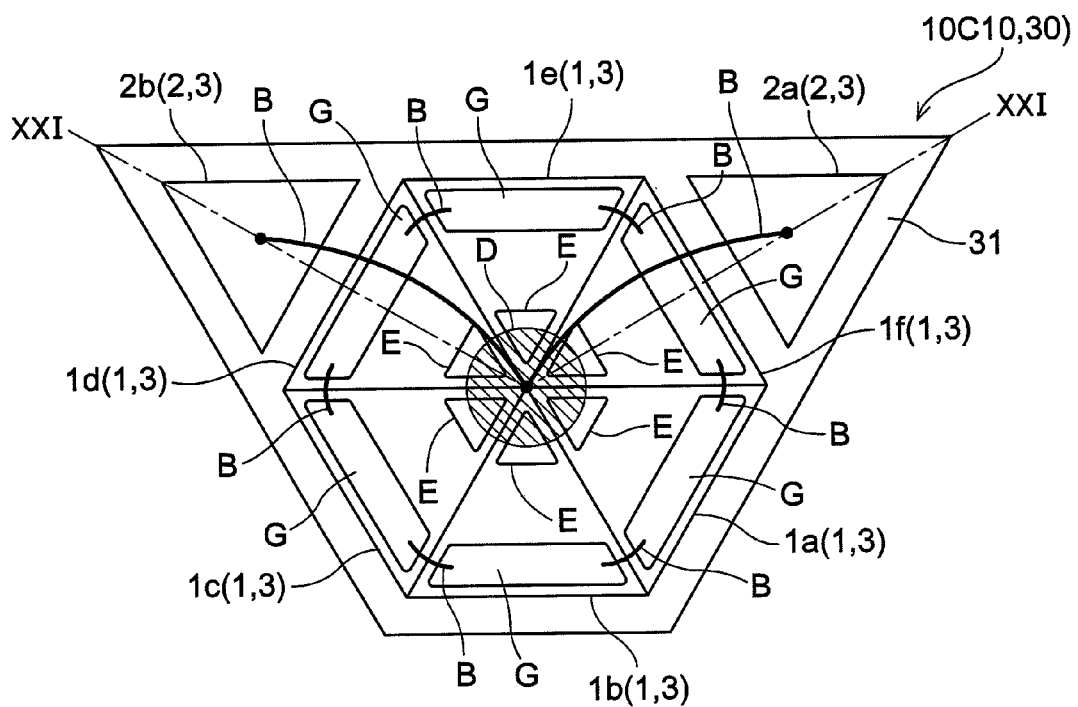
FIG. 20 is a top plan view schematically showing an example of construction extended from the IGBT module shown in FIG. 19.
Figure 21:
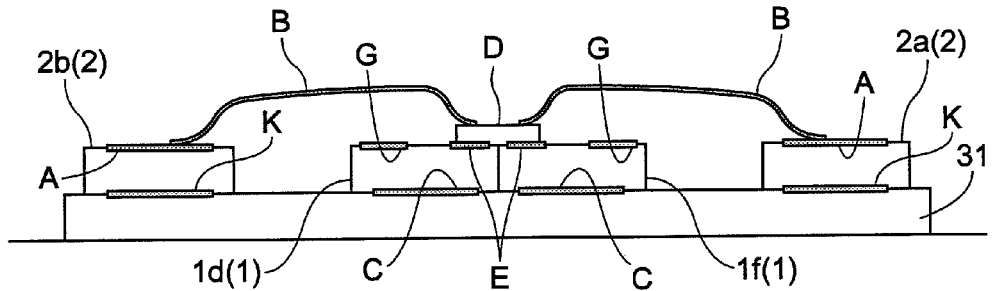
FIG. 21 is a side view schematically showing an example of construction of IGBT module.

Further, the IGBT module 10B shown in FIG. 19 can be even further extended. FIG. 20 is a top plan view showing an example of the construction of an IGBT module 10C further extended or modified from the IGBT module 10B shown in FIG. 19. FIG. 21 is a section taken along XXI-XXI in FIG. 20. As shown in FIG. 20 and FIG. 21, a single IGBT module 10C (power semiconductor module 30) can be formed on the copper plate 31, including a diode chip 2.

Discussion about the regular hexagonal interconnection of the six regular triangular IGBT chops 1 (1a-1f) will be omitted, since it is similar to the construction shown in FIG. 19. However, in this example, the IGBT chips 1a-1f are not regular hexagonal, but will be soldered to the copper plate 31 having equilateral trapezoidal shape, with using the high melting point solder 32. If the longer side of the parallel paired sides of the equilateral trapezoid is defined here as the lower side, it may be that the diode chips 2 are mounted at the two corner portions at the opposite terminal ends of this lower side. As the copper plate 31 is connected to the collector terminals C of the IGBT chips 1, the cathode terminals K of the diode chips 2 will be soldered with using the high melting point solder 32 (see FIG. 1). That is to say, via the copper plate 31, the collector terminals C of the respective IGBT chips 1 (1a-1f) and the cathode terminals K of the two diode chips 2 (2a, 2b) are connected. The diode chips 2a, 2b correspond to the flywheel diodes 20 shown in FIG. 1.

Figure 22:
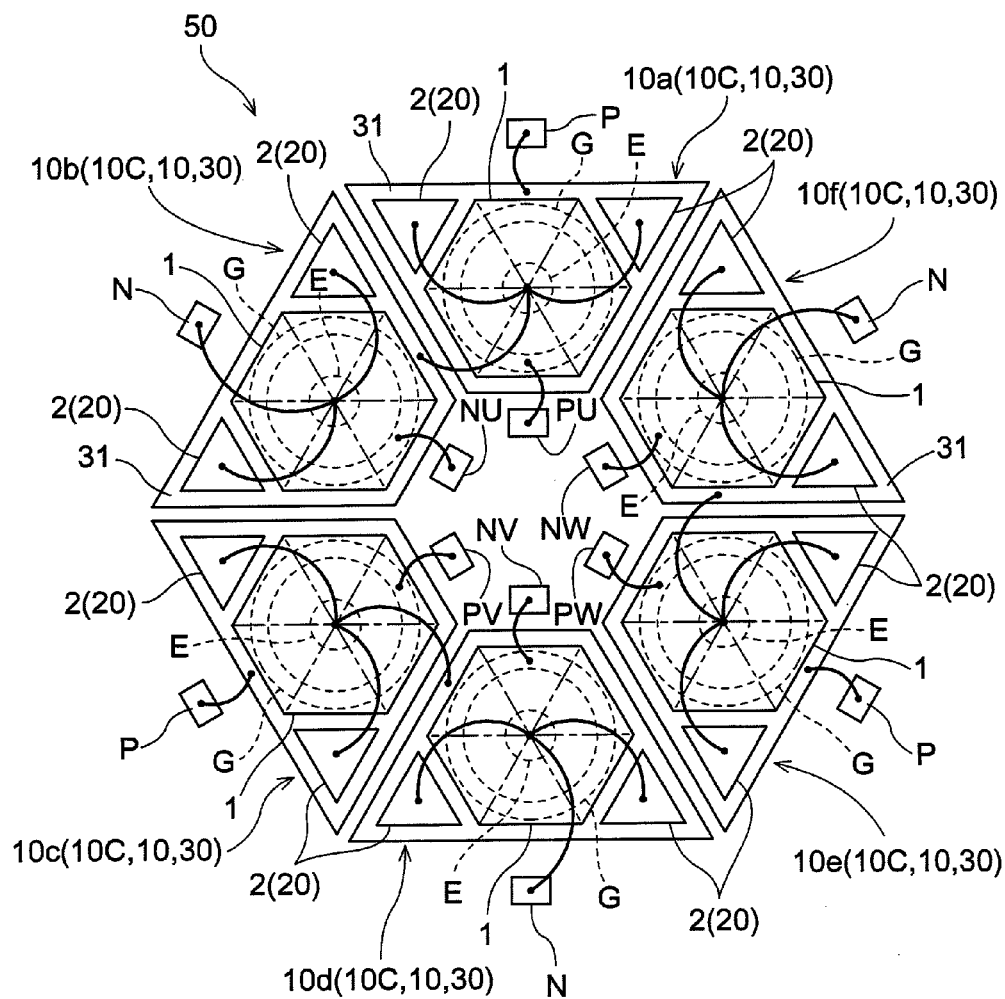
FIG. 22 is an explanatory view schematically showing an example of construction of an inverter using the IGBT module show in FIG. 20.

FIG. 22 is an explanatory view schematically showing an exemplary construction of the inverter using the IGBT module 10C shown in FIG. 20. Similarly to the construction shown in FIG. 18, the inverter 50 is formed by arranging six power semiconductor modules 10C into a regular hexagonal annular formation. In FIG. 20, the IGBT module 10a (10C) functions as a high side switch for the U phase incorporated within the flywheel diode 20a. The IGBT module 10b (10C) functions as a low side switch for the U phase incorporated within the flywheel diode 20b. The IGBT module 10c (10C) functions as a high side switch for the V phase incorporated within the flywheel diode 20c. The IGBT module 10d (10C) functions as a low side switch for the V phase incorporated within the flywheel diode 20d. The IGBT module 10e (10C) functions as a high side switch for the W phase incorporated within the flywheel diode 20e. The IGBT module 10f (10C) functions as a low side switch for the W phase incorporated within the flywheel diode 20f.

As shown hereinbefore in the circuit block diagram of FIG. 1, the copper plate 31 conductive to the collector terminal C of the IGBT module 10a is connected to the positive side P of the DC power source. To the gate terminal G of the IGBT module 10a, there is connected an inverter drive signal PU from the control unit 6. The emitter terminal E of the IGBT module 10a is connected to the copper plate 31 conductive to the collector terminal C of the IGBT module 10b disposed adjacent thereto. The emitter terminal E of the IGBT module 10a is connected to the anode electrodes A of the two diode chips 2 mounted on the IGBT module 10a. To the gate terminal G of the IGBT module 10b, there is connected an inverter drive signal NU from the control unit 6. The emitter terminal E of the IGBT module 10b is connected to the negative side N of the DC power source. Further, the emitter terminal E of the IGBT module 10b is connected to the anode terminals A of the two diode chips mounted on the IGBT module 10a. That is to say, between the positive side P and the negative side N of the DC power source, a serial circuit comprising the two IGBT modules 10C incorporating the two flywheel diodes 20 is formed in correspondence with the U phase.

Similarly to the above, a serial circuit comprising the IGBT modules 10c and 10d is formed in correspondence with the V phase. And, a serial circuit comprising the IGBT modules 10e and 10f is formed in correspondence with the W phase.

Figure 23:
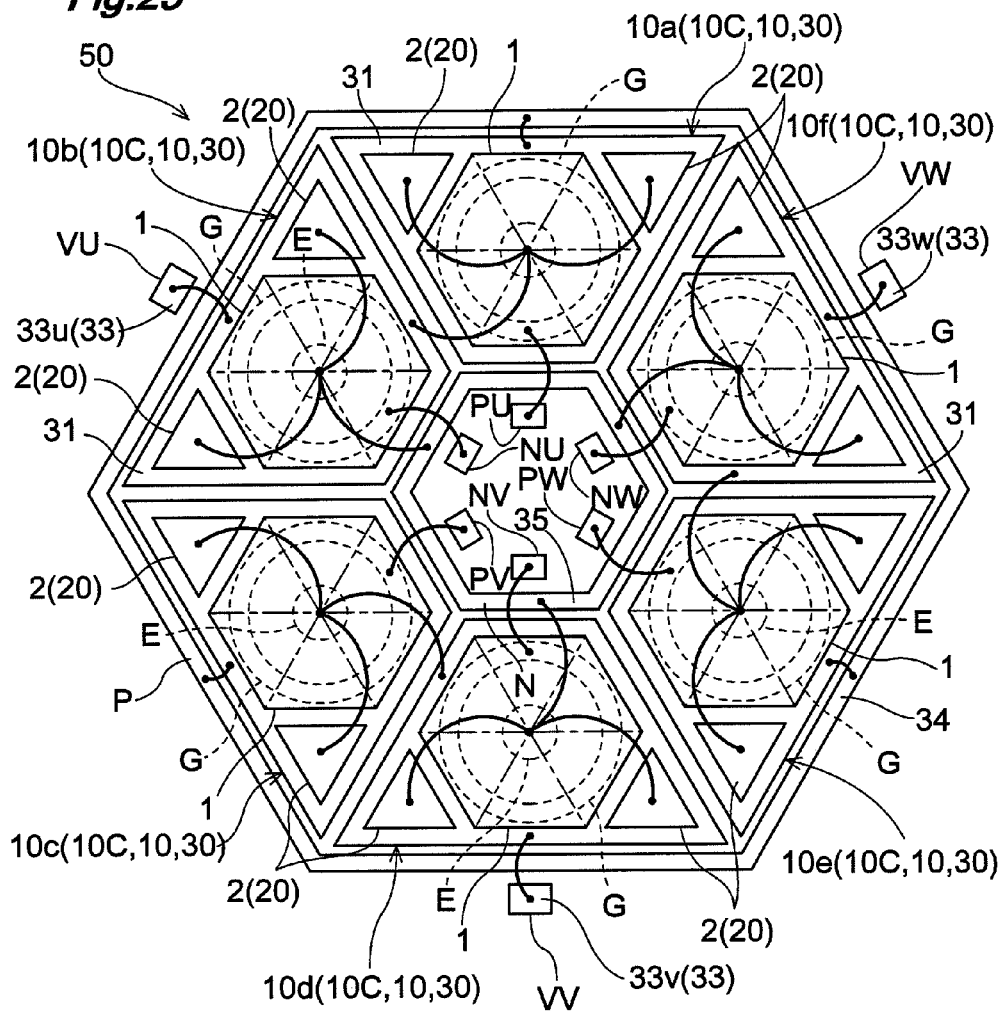
FIG. 23 is an explanatory view schematically showing an example of construction in which common plates for power source connection are provided in the inverter of FIG. 22.

In the above, the positive side P and the negative side N of the DC power source are common to each one of the three IGBT modules 10. Therefore, it is advantageous to provide a common plate for power connection. FIG. 23 is an explanatory view showing an example of the construction in case common plates 34, 35 for power source connection are provided in the inverter 50 shown in FIG. 22. On the outer peripheral side, the common plate 34 connected to the positive side P is provided and on the inner peripheral side, the common plate 35 connected to the negative side N is provided. Needless to say, conversely, the common plate to be connected to the positive side P may be provided on the inner peripheral side and the common plate to be connected to the negative side N may be provided on the outer peripheral side.

On the other hand, in the stator 70s of the motor 70, there are provided three-phase drive voltage terminals 33 (33u, 33v, 33w) to which three-phase drive voltages VU, VV, VW outputted from the three IGBT modules 10b, 10d, 10f are connected respectively. To the three phase drive voltage terminals 33u, 33v, 33w, coil ends of the stator coils 7u, 7v, 7w are connected respectively. At least three IGBT modules 10b, 10d, 10f are provided with terminals connectable to these three phase drive voltage terminals 33, so that the stator coils 7 and the inverter 50 are connected to each other.

Figure 24:
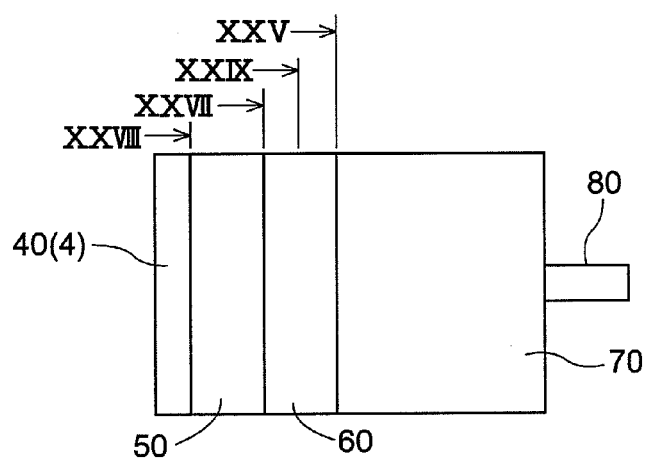
FIG. 24 is a side view schematically showing layout of a motor and an inverter in an inverter-integrated motor.
Figure 25:
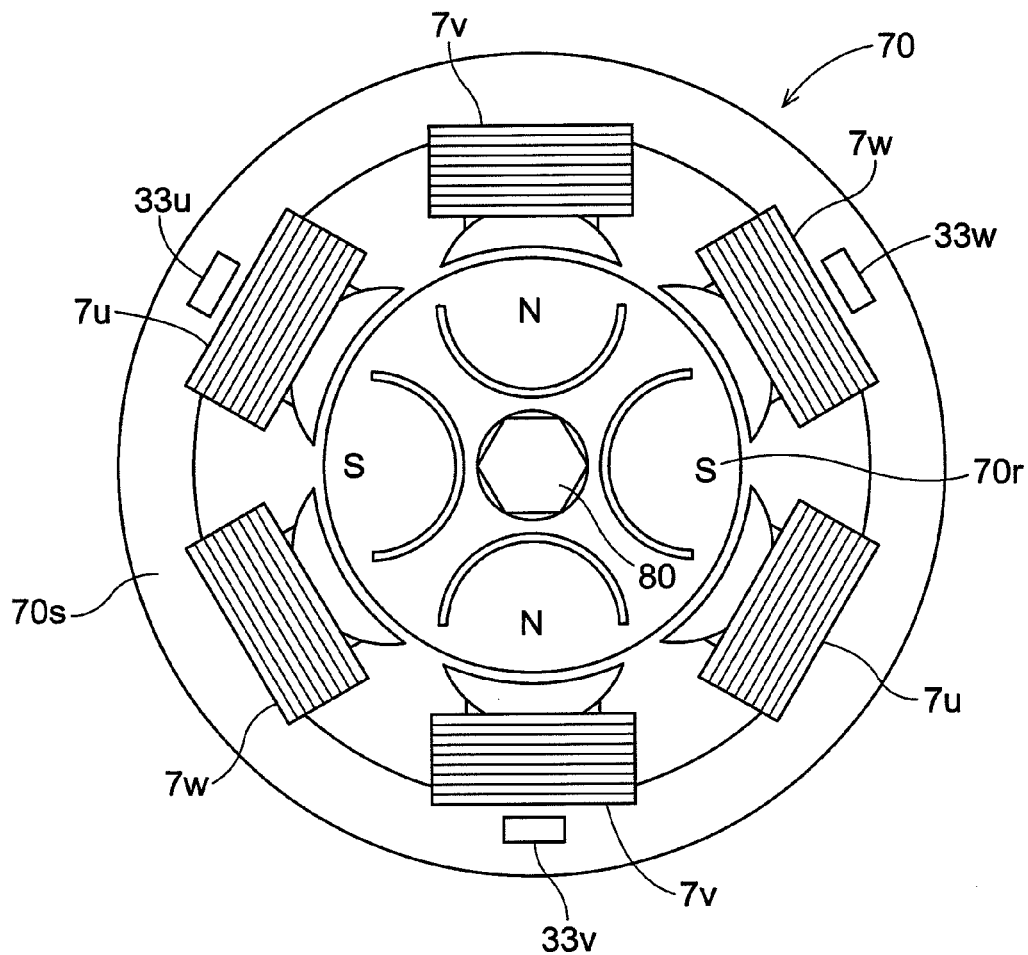
FIG. 25 is a section view taken along XXV direction in FIG. 24.
Figure 26:
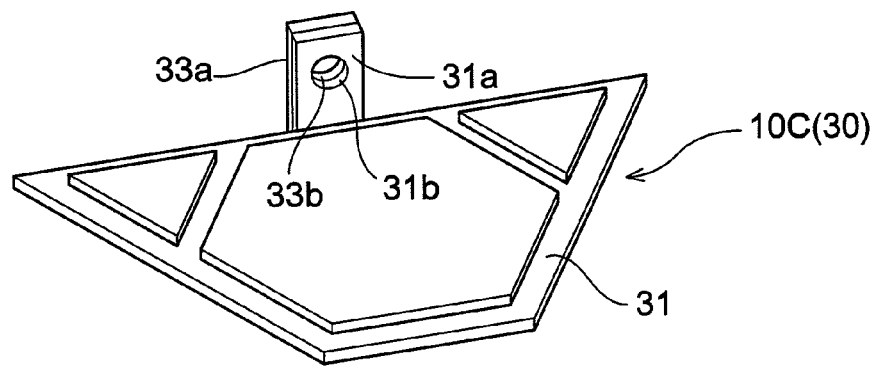
FIG. 26 is a perspective view schematically showing an example of connection arrangement between a stator coil and an inverter.
Figure 27:
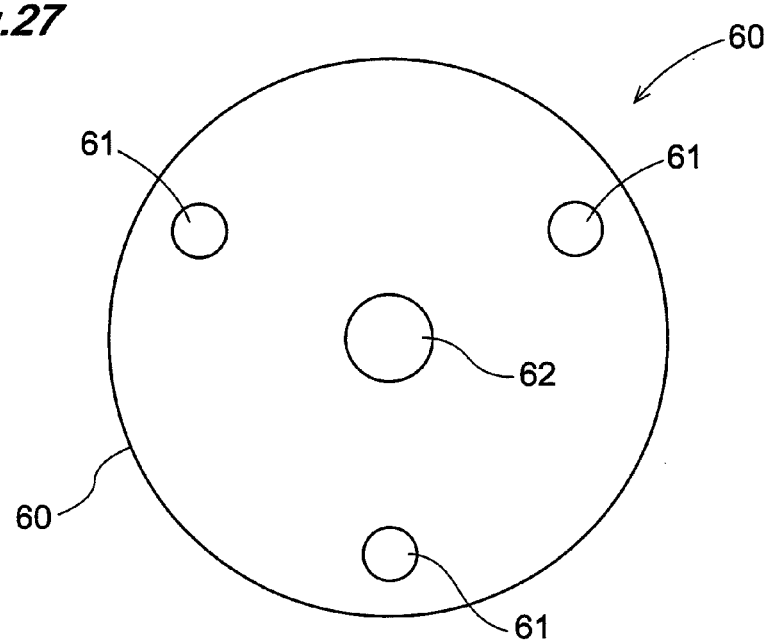
FIG. 27 is a section view taken along XXVII direction in FIG. 24.
Figure 28:
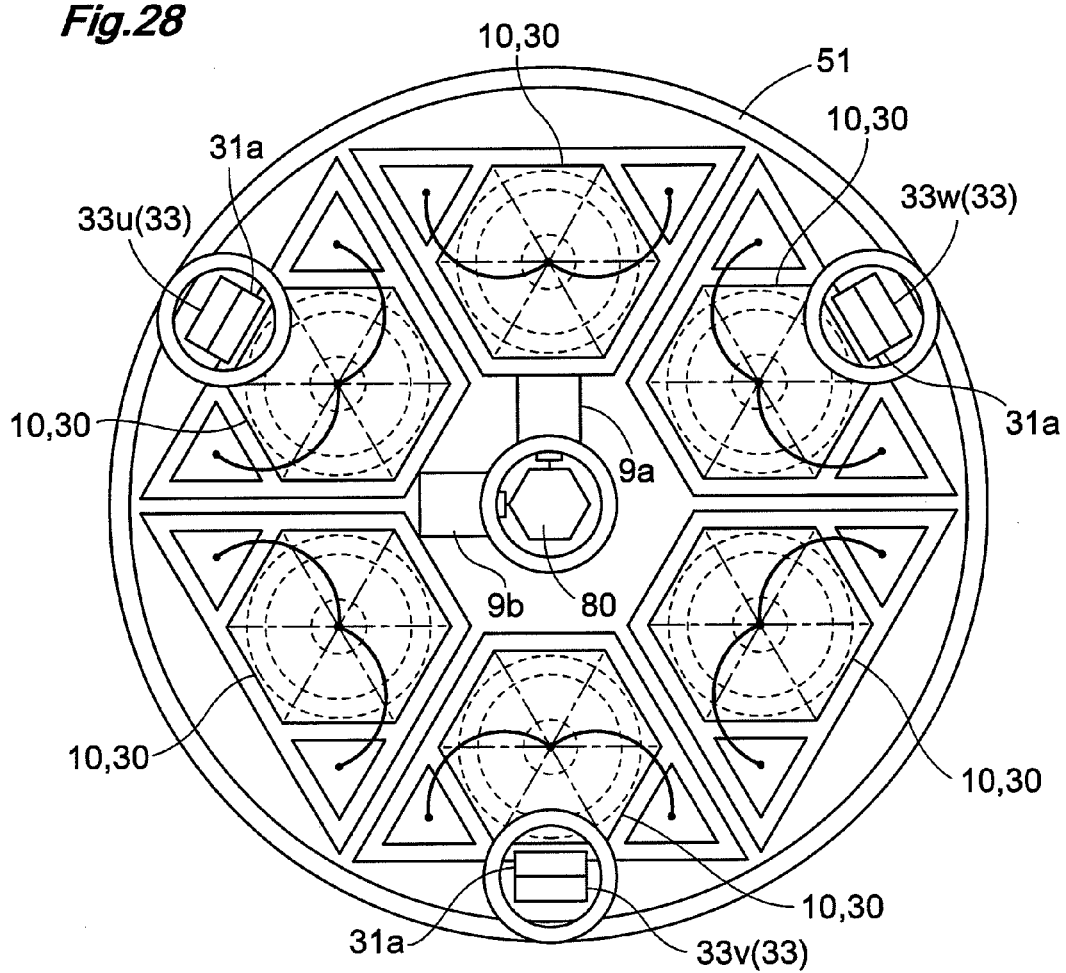
FIG. 28 is a section view taken along XXVIII direction in FIG. 24.

Next, some additional explanation will be given on a method of connecting the stator coils 7 and the inverter 50. FIG. 24 is a side view schematically showing layout of the motor 70 and the inverter 50 in an inverter-integrated motor. As shown, the inverter 50 is integrated with the motor 70 via a water-cooling jacket 60. The water-cooling jacket 60 is a cooling unit capable of cooling both the inverter 50 and the motor 70. FIG. 25 is a view taken along XXV in FIG. 24 and schematically shows the construction of the motor 70 at its portion connected to the inverter 50. FIG. 26 is a perspective view schematically showing an example of the mode of connection between the stator coils 7 and the inverter 50. FIG. 27 is a view taken along XXVII in FIG. 24 and shows the outer appearance of the water-cooling jacket 60. FIG. 28 is a view taken along XXVIII in FIG. 24 and shows the outer appearance of the inverter 50 housed in a housing 51.

As shown in FIG. 25, the three three-phase drive voltage terminals 33 (33u, 33v, 33w) are provided to project in the direction to the inverter 50. Incidentally, the three-phase drive voltage terminals 33, as will be detailed later, extend through the through holes 61 of the water-cooling jacket 60 to reach the inverter 50. A through hole 62 is a hole for inserting a shaft 80 (rotational shaft) rotatable in unison with the rotor 70r of the motor 70.

On the other hand, in the copper plates 31 of at least three IGBT modules 10b, 10d, 10f, as shown in FIG. 26, there are provided terminals 31a rising vertically from the plate surfaces of the copper plates 31. As shown in FIG. 24, when the motor 70 and the inverter 50 are set in position, there is provided a positional relationship that allows the bonding connection between the terminals 31a and the three-phase drive voltage terminals 33. In the terminals 31a and the three-phase drive voltage terminals 33, there are provided through holes 31b and 33b which are in registry with each other at the time of connection therebetween. And, as bolts (not shown) are inserted into the through holes 31b, 33b at the time of connection therebetween and then fastened with nuts, the terminals 31a and the three-phase drive voltage terminals 33 are placed into close contact with each other. Needless to say, other types of connection such as soldering between the terminals 31a and the three-phase drive voltage terminals 33 are also possible.

In the foregoing, it was explained that the terminals 31a are provided in the copper plates 31 of at least three IGBT modules 10b, 10d, 10f. Needless to say; however, the terminals 31a can be provided in the copper plates 31 of all of the IGBT modules 10. And, by forming the components identical, the manufacture costs can be reduced.

Further, as long as distinction from the tree-phase drive voltage terminals 33 of the stators 70s is maintained, with a similar construction to the above, the terminals 31a of the three IGBT modules 10a, 10c, 10e can be connected to the common plate 34 connected to the positive side P.

Figure 29:
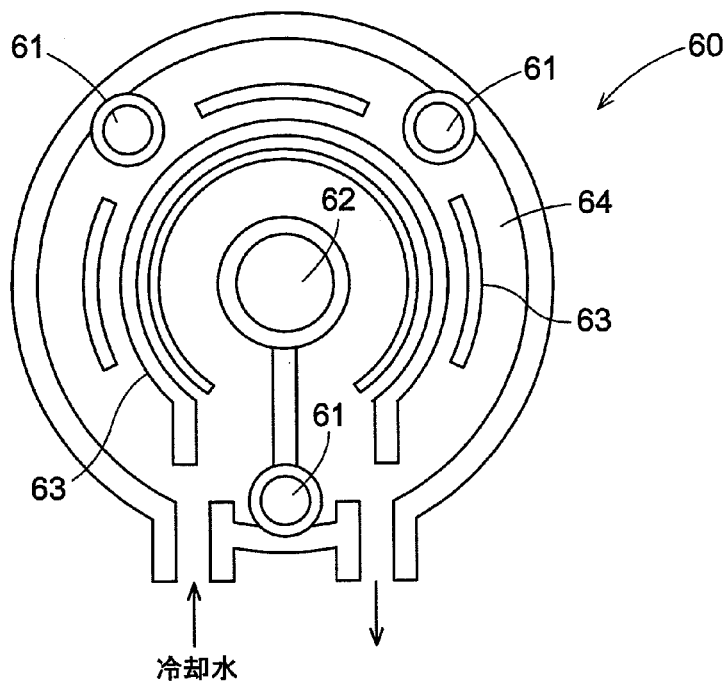
FIG. 29 is a section view taken along XXIX direction in FIG. 24.

FIG. 29 is a view taken along XXIX in FIG. 24 and shows, in section, water-cooling water paths in the water-cooling jacket 60. As described hereinbefore, this one water-cooling jacket 60 cools both the motor 70 and the inverter 50. Also, the connecting lines connecting between the stator coils 7 and the inverter 50 are connected through the through holes 61 of the water-cooling jacket 60. Therefore, although this construction employs water-cooling arrangement, there is no problem in the waterproof proof performance. Inside the water-cooling jacket 60, water passages 64 separated by a plurality of water cooling fins 63 are formed. Depending on the amount of heat generated from the inverter 50 and the motor 70, the number of the cooling fins 63 and the width of the water passages 64 can be adjusted appropriately. As the inverter 50, the water-cooling jacket 60 and the motor 70 are provided independently of each other, a suitable cooling jacket 60 can be selected appropriately, depending on the need.

Though not shown, between the inverter 50 and the water-cooling jacket 60, a member formed of a material having good heat conductivity such as an alumina ($Al_2O_3$) plate or the like is sandwiched. For instance, a housing 51 of the inverter 50 shown in FIG. 28 can be formed using alumina and the IGBT module 10 may be placed in close contact with the bottom of this housing 51. Heat generated from the IGBT chips 1 and the diode chips 2 will be conducted via the copper plates 1 and alumina to the water-cooling jacket 60.

Figure 30:
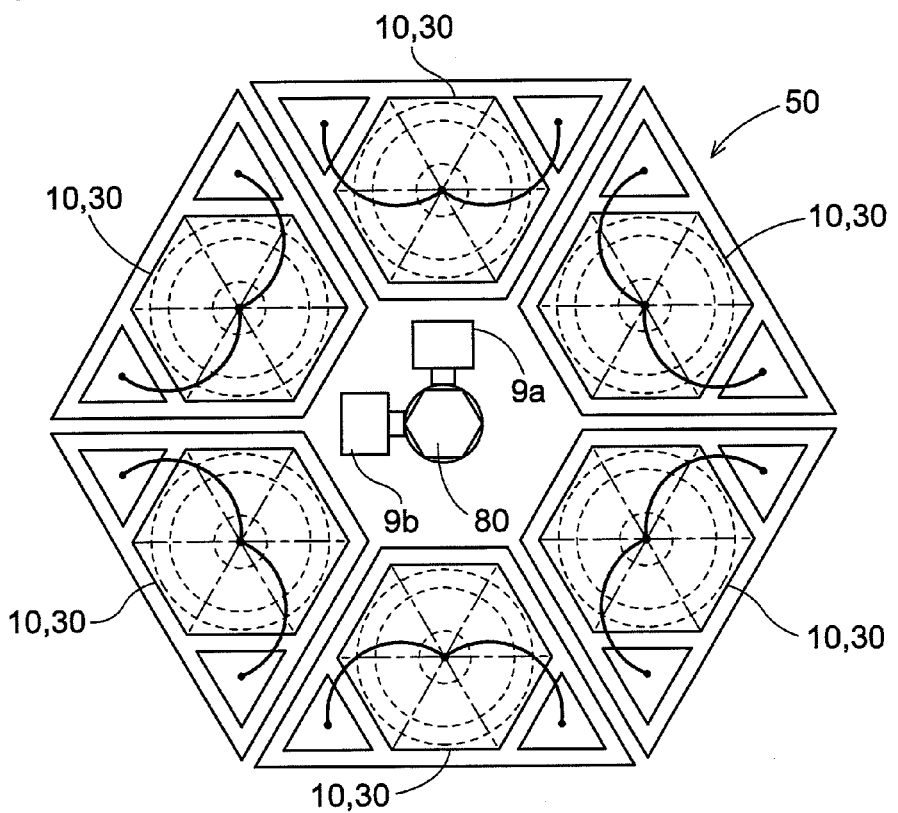
FIG. 30 is an explanatory view showing layout of rotation detecting sensors.

FIG. 30 is an explanatory view showing layout of the rotation detecting sensors 9a, 9b. The shaft 80 (rotational shaft) rotatable in unison with the rotor 70r of the motor 70 extends through the free space formed at the center of the inverter 50. The inverter 50 has a regular hexagonal shape (right polygonal shape) and therefore, at the free space formed at its center, the rotation detecting sensors 9a, 9b can be disposed effectively. The rotation detecting sensors 9a, 9b are arranged with a 90 degrees phase difference therebetween. Incidentally, the shaft 80 can advantageously be formed into regular hexagonal cross sectional shape in order to make the rotation detection easier.

The inverter 50 is provided with water proof treatment for prevention invasion of oil, water or the like. Therefore, by disposing the rotation detecting sensors 9a, 8b within this inverter 50, the rotation detecting sensors 9a, 9b can be disposed in a stable environment under the protection with the water proof treatment.

In general, a rotation detecting sensor needs to be attached in the vicinity of the shaft 80 rotatable with the motor 70. So, the layout of the signal lines thereof tends to be troublesome. Or, there tends to occur such problem as disadvantageous elongation of the motor (body). However, disposing the sensors at the free space formed at the center of the annular-shaped inverter 50 can solve these problems. Further, as a result of it, the rotation detecting sensors can be added at low costs.

There are various kinds of rotation detecting sensors, such as magnetoresistance type or magnetic semiconductor type, power generating type or variable reactance type, light reflecting type, and so on. However, for the purpose of integrating them in the water-proof type inverter 50, using the magnetoresistance type or the magnetic semiconductor type sensors is advantageous since these types allow forming the rotation detecting sensors compact. The power generating type sensor and the variable reactance type sensors utilize the magnetic induction principle, thus have the advantage of possibility of obtaining power generation voltage in proportion to the rotational speed thereof. However, zero detection (position detection) is difficult with these types. The light reflecting type sensor has superior resistance against electromagnetic noise, but can be considerably affected by soiling or dirt. On the other hand, with the magnetoresistance type or magnetic semiconductor type sensor, its output signal allows position detection regardless of the rotational speed and has high resistance against soiling and also can be formed compact. For these reasons, they are suitable as the types of sensors for use in this embodiment.

The power stabilizing capacitor 4 (see FIG. 1) of the inverter 50 is disposed adjacent the inverter 50 as shown in FIG. 24. The capacitor 4 is a large-capacity capacitor of 1000μ to 2000 μF. In this embodiment, as shown in FIG. 24, this capacitor is comprised of a film capacitor 40 having substantially same diameter as the housing 51 of the inverter 50.

As described above, through the flexible combination of the regular triangular power semiconductor chips 3, power semiconductor modules 30 having a great variety of shapes can be formed as desired. And, with using thus formed power semiconductor modules 30, a nearly annular inverter 50 can be formed advantageously. And, this nearly annular (ring-shaped) inverter 50 is easily integrated with the motor 70 with the center of the inverter being in agreement with the rotational shaft of the motor 70. Further, in this integration, the inverter 50 and the motor 70 can be connected to each other via a short distance. Moreover, since the inverter 50 and the motor 70 can be in contact with each other over a large area, it becomes also possible to cool both of them at one time.

Industrial Applicability

As described above, according to the present invention, it is possible to provide a semiconductor chip which allows the motor and the inverter to be integrated together in an efficient and effective manner. Moreover, with using this semiconductor chip, it is possible to provide an inverter-integrated motor having good balance among the three phases of the wires between the inverter and the motor and having also high cooling performance for both the inverter and the motor.

The invention claimed is:

1. A power semiconductor chip that constitutes a power semiconductor device for use in a power electronics circuit, the power semiconductor chip comprising:
a die having a regular triangular surface shape;
the die including a power transistor having three terminals of an emitter/source, a collector/drain and a base/gate;
the emitter/source terminal is disposed at the apex of one face of the die having the regular triangular shape;
the base/gate terminal is disposed adjacent the opposite side to the apex of the one face; and
the collector/drain terminal is disposed on the other face.

2. The power semiconductor chip according to claim 1, wherein a plurality of power semiconductor cells having a regular hexagonal column shape or a circular cylindrical shape are arranged in a zigzag pattern, and these respective semiconductor cells are connected and integrated together to form the power semiconductor chip.

3. The power semiconductor chip according to claim 2, wherein
the power semiconductor chip comprises a power transistor having three terminals of an emitter/source, a collector/drain and a base/gate;
the emitter/source terminal is disposed at the apex of one face of the die which has a regular triangular shape;
the base/gate terminal is disposed adjacent the opposite side to the apex of the one face; and
the collector/drain terminal is disposed on the other face.

4. A power semiconductor module, wherein the module is formed by electrically conductively interconnecting same terminals of the power semiconductor chips according to claim 3.

5. An inverter apparatus formed by using the power semiconductor module according to claim 4 and configured to covert a DC power into a three-phase AC power,
wherein the apparatus is formed by arranging six of the power semiconductor modules in the form of a regular hexagon.

6. The power semiconductor chip according to claim 1, wherein
a plurality of power semiconductor cells having a regular hexagonal column shape or a circular cylindrical shape are arranged in a zigzag pattern, and these respective semiconductor cells are connected and integrated together to form the power semiconductor chip;
the power semiconductor cell comprises an insulated gate bipolar transistor having three electrodes of an emitter electrode, a collector electrode and a gate electrode; and
the gate electrode is formed, via an insulating layer, inside a trench in the form of a vertical pit that is completed within the single power semiconductor cell.

7. The power semiconductor chip according to claim 6, wherein the power semiconductor cells include, at the respective gate electrodes thereof to be connected to the gate terminal of the power semiconductor chip, a gate resistor according to a wiring distance from the gate terminal.

8. The power semiconductor chip according to claim 1, the chip is integrated to a wafer having a lattice structure [1, 1, 1].

9. A power semiconductor module, wherein the module is formed by electrically conductively interconnecting same terminals of the power semiconductor chips according to claim 1.

10. The power semiconductor module according to claim 9, wherein the module is formed into a regular hexagonal shape by interconnecting six of the power semiconductor chips with placing the apices of the power semiconductor chips in abutment against each other.

11. The power semiconductor module according to claim 10, wherein
the power semiconductor chips connected in the regular hexagonal shape comprise power transistors;
one face of a die of a same shape as the power semiconductor module of the power transistors is an anode terminal and the other face thereof is a cathode terminal and there are provided two of the power semiconductor chips of a different kind to be connected as regenerating diodes to the power transistors; and
the power semiconductor transistors as the regenerating diodes are disposed in such a manner that one sides of the respective transistors are disposed parallel relative to two sides adjacent across one side of the power transistor, so that the eight power semiconductor chips in total together form an isosceles trapezoidal shape.

12. The power semiconductor module according to claim 9, wherein three of the power semiconductor chips are connected in an isosceles trapezoidal shape with placing the apices of the regular triangular power transistor chips in abutment against each other.

13. An inverter apparatus formed by using the power semiconductor module according to claim 9 and configured to covert a DC power into a three-phase AC power,
wherein the apparatus is formed by arranging six of the power semiconductor modules in the form of a regular hexagon.

14. An inverter-integrated motor wherein the inverter apparatus according to claim 13 is provided at an end of a motor, with placing the center of the regular hexagonal inverter apparatus in agreement with a rotational shaft of the motor.

15. The inverter-integrated motor according to claim 14, further comprising a cooling unit provided between the motor and the inverter apparatus, the cooling unit being capable of cooling both the motor and the inverter apparatus.

16. The inverter-integrated motor according to claim 14, wherein there is provided a rotation detecting sensor in a space formed at the center of the inverter apparatus having the regular hexagonal shape, the rotation detecting sensor being configured to detect a rotational position of a rotor of the motor based on a rotational position of the rotational shaft.

17. A power semiconductor module, wherein the module is formed by electrically conductively interconnecting same terminals of the power semiconductor chips according to claim 2.

18. An inverter apparatus formed by using the power semiconductor module according to claim 17 and configured to covert a DC power into a three-phase AC power,
wherein the apparatus is formed by arranging six of the power semiconductor modules in the form of a regular hexagon.

* * * * *